(12) United States Patent
Takeuchi

(10) Patent No.: US 7,607,074 B2
(45) Date of Patent: Oct. 20, 2009

(54) ERROR DETECTING CODE ADDITION CIRCUIT, ERROR DETECTION CIRCUIT AND METHOD, AND DISC APPARATUS

(75) Inventor: Hiroki Takeuchi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 670 days.

(21) Appl. No.: 11/280,431

(22) Filed: Nov. 17, 2005

(65) Prior Publication Data

US 2006/0156202 A1 Jul. 13, 2006

(30) Foreign Application Priority Data

Dec. 1, 2004 (JP) .............................. 2004-348311

(51) Int. Cl.
*G08C 25/00* (2006.01)
(52) U.S. Cl. ...................... 714/799; 714/710; 714/785
(58) Field of Classification Search ................. 714/710, 714/799, 785
See application file for complete search history.

(56) References Cited

U.S. PATENT DOCUMENTS

| 6,615,387 | B1 * | 9/2003 | Williamson et al. .......... 714/785 |
| 2003/0135798 | A1 * | 7/2003 | Katayama et al. ............ 714/710 |

FOREIGN PATENT DOCUMENTS

| JP | 8-149017 | 6/1996 |
| JP | 2001-292066 | 10/2001 |
| JP | 2003-242720 | 8/2003 |
| JP | 2003-242728 | 8/2003 |

OTHER PUBLICATIONS

"Next generation optical disc" Nikkei Electronics Books, Oct. 7, 2003.
Taiwanese Office Action dated Apr. 27, 2009 with English Translation.
Japanese Office Action dated Nov. 18, 2008 with Partial English Translation.

* cited by examiner

*Primary Examiner*—Guy J Lamarre
*Assistant Examiner*—Sam Rizk
(74) *Attorney, Agent, or Firm*—McGinn IP Law Group, PLLC

(57) ABSTRACT

An error detector includes a substitute value output section outputting a specific substitute value corresponding to an encoding byte sequence Q of input byte data by referring to a table storing, as a substitute value, a value obtained by inputting a substitute code string to a shift register that produces an error detecting value upon input of a code string in an encoding byte sequence Q, a bit processing operation section calculating an error detecting value per byte, and a byte processing operation section outputting an error detecting value of a code string. The substitute code string contains byte data of K number of bytes where only predetermined bit data in byte data corresponding to the encoding byte sequence Q indicates "1" and all other bit data indicates "0". The bit processing operation section processes each byte data and its substitute value in a different processing sequence from the encoding sequence.

20 Claims, 18 Drawing Sheets

Fig. 3

| | N=0 | N=1 | N=2 | N=3 | N=4 | N=5 | N=6 | N=7 | N=8 | N=9 | N=10 | N=11 | N=12 | N=13 | N=14 | N=15 | N=16 | N=17 | N=18 |
|---|---|---|---|---|---|---|---|---|---|---|---|---|---|---|---|---|---|---|---|
| M=0 | 0 | 216 | 432 | 648 | 864 | 1080 | 1296 | 1512 | 1728 | 1944 | 108 | 324 | 540 | 756 | 972 | 1188 | 1404 | 1620 | 1836 |
| M=1 | 1 | 217 | 433 | 649 | 865 | 1081 | 1297 | 1513 | 1729 | 1945 | 109 | 325 | 541 | 757 | 973 | 1189 | 1405 | 1621 | 1837 |
| M=2 | 2 | 218 | 434 | 650 | 866 | 1082 | 1298 | 1514 | 1730 | 1946 | 110 | 326 | 542 | 758 | 974 | 1190 | 1406 | 1622 | 1838 |
| M=3 | 3 | 219 | 435 | 651 | 867 | 1083 | 1299 | 1515 | 1731 | 1947 | 111 | 327 | 543 | 759 | 975 | 1191 | 1407 | 1623 | 1839 |
| M=4 | 4 | 220 | 436 | 652 | 868 | 1084 | 1300 | 1516 | 1732 | 1948 | 112 | 328 | 544 | 760 | 976 | 1192 | 1408 | 1624 | 1840 |
| M=5 | 5 | 221 | 437 | 653 | 869 | 1085 | 1301 | 1517 | 1733 | 1949 | 113 | 329 | 545 | 761 | 977 | 1193 | 1409 | 1625 | 1841 |
| M=6 | 6 | 222 | 438 | 654 | 870 | 1086 | 1302 | 1518 | 1734 | 1950 | 114 | 330 | 546 | 762 | 978 | 1194 | 1410 | 1626 | 1842 |
| M=7 | 7 | 223 | 439 | 655 | 871 | 1087 | 1303 | 1519 | 1735 | 1951 | 115 | 331 | 547 | 763 | 979 | 1195 | 1411 | 1627 | 1843 |
| ... | | | | | | | | | | | | | | | | | | | |
| M=214 | 214 | 430 | 646 | 862 | 1078 | 1094 | 1510 | 1726 | 1942 | 106 | 322 | 538 | 754 | 970 | 1186 | 1402 | 1618 | 1834 | 2050 |
| M=215 | 215 | 431 | 647 | 863 | 1079 | 1095 | 1511 | 1727 | 1943 | 107 | 323 | 539 | 755 | 971 | 1187 | 1403 | 1619 | 1835 | 2051 |

N: COLUMN NUMBER
M: BYTE ROW NUMBER
RECORDING BYTE SEQUENCE P →
ENCODING BYTE SEQUENCE Q →
EVEN NUMBER CODE STRING
ODD NUMBER CODE STRING $b_{15} = b_{13} + b_{10} + b_8 + b_7 + b_5 + b_4 + b_3 + b_0$
$b_{14} = b_{15} + b_{14} + b_9 + b_7 + b_6 + b_4 + b_2$
$b_{13} = b_{14} + b_{13} + b_8 + b_6 + b_5 + b_3 + b_1$
$b_{12} = b_{13} + b_{12} + b_7 + b_5 + b_4 + b_2 + b_0$
$b_{11} = b_{15} + b_{14} + b_{11} + b_6 + b_4 + b_1$
$b_{10} = b_{14} + b_{13} + b_{10} + b_5 + b_3 + b_0$
$b_9 = b_{15} + b_{14} + b_{13} + b_9 + b_4 + b_3 + b_2$
$b_8 = b_{14} + b_{13} + b_{12} + b_8 + b_3 + b_2 + b_1$
$b_7 = b_{13} + b_{12} + b_{11} + b_7 + b_2 + b_1 + b_0$
$b_6 = b_{15} + b_{14} + b_{11} + b_{10} + b_6 + b_3 + b_1 + b_0$
$b_5 = b_{15} + b_{13} + b_{12} + b_{10} + b_9 + b_5 + b_3 + b_2 + b_0$
$b_4 = b_{15} + b_{11} + b_9 + b_8 + b_4 + b_3 + b_2 + b_1$
$b_3 = b_{14} + b_{10} + b_8 + b_7 + b_3 + b_2 + b_1 + b_0$
$b_2 = b_{15} + b_{14} + b_{13} + b_{12} + b_9 + b_7 + b_6 + b_3 + b_2 + b_1 + b_0$
$b_1 = b_{15} + b_{13} + b_{11} + b_8 + b_6 + b_5 + b_3 + b_2 + b_1 + b_0$
$b_0 = b_{15} + b_{10} + b_7 + b_5 + b_4 + b_3 + b_2 + b_1 + b_0$ $b_{15} = b_{15} + b_{13} + b_{12} + b_7 + b_6 + b_3 + b_0$
$b_{14} = b_{15} + b_{11} + b_6 + b_5 + b_3 + b_2$
$b_{13} = b_{14} + b_{10} + b_5 + b_4 + b_2 + b_1$
$b_{12} = b_{13} + b_9 + b_4 + b_3 + b_1 + b_0$
$b_{11} = b_{15} + b_{14} + b_8 + b_2 + b_0$
$b_{10} = b_{15} + b_{13} + b_{12} + b_7 + b_3 + b_1$
$b_9 = b_{14} + b_{12} + b_{11} + b_6 + b_2 + b_0$
$b_8 = b_{15} + b_{14} + b_{13} + b_{12} + b_{11} + b_{10} + b_5 + b_3 + b_1$
$b_7 = b_{14} + b_{13} + b_{12} + b_{11} + b_{10} + b_9 + b_4 + b_2 + b_0$
$b_6 = b_{15} + b_{14} + b_{13} + b_{11} + b_{10} + b_9 + b_8 + b_1$
$b_5 = b_{14} + b_{13} + b_{12} + b_{10} + b_9 + b_8 + b_7 + b_0$
$b_4 = b_{15} + b_{14} + b_{13} + b_{11} + b_9 + b_8 + b_7 + b_6 + b_3$
$b_3 = b_{14} + b_{13} + b_{12} + b_{10} + b_8 + b_7 + b_6 + b_5 + b_2$
$b_2 = b_{13} + b_{12} + b_{11} + b_9 + b_7 + b_6 + b_5 + b_4 + b_1$
$b_1 = b_{12} + b_{11} + b_{10} + b_8 + b_6 + b_5 + b_4 + b_3 + b_0$
$b_0 = b_{15} + b_{14} + b_{12} + b_{11} + b_{10} + b_9 + b_7 + b_5 + b_4 + b_2$

ERROR DETECTING CODE ADDITION CIRCUIT, ERROR DETECTION CIRCUIT AND METHOD, AND DISC APPARATUS

BACKGROUND OF THE INVENTION

1. Field of the Invention

The present invention relates to an error detecting code addition circuit that adds an error detecting code to data to be stored in a disc, an error detection circuit and method that detect an error in data read from a disc, and a disc apparatus that includes an error detecting code addition circuit and/or an error detection circuit.

2. Description of Related Art

Following so-called 1st generation optical discs such as CD, CD-R/RW and CD-ROM and 2nd generation optical discs such as Digital Versatile Disc (DVD), so-called 3rd generation optical disc that is Blu-ray discs with a shorter light source wavelength of 405 nm (blue-violet light) has been developed (cf. "Next generation optical disc" Nikkei Electronics Books, Oct. 7, 2003). The Blu-ray discs allows reading and writing record marks at a recording density of about five times that of DVD by increasing the numerical aperture (NA) of an objective lens to 0.85 to reduce a beam spot area to about one-fifth that of DVD in addition to shortening a light source wavelength. Further, Blu-ray discs have a phase change recording layer that is covered with a transparent covering layer of 0.1 mm thick and placed on a disc substrate, thereby reducing aberration due to the relative inclination of a disc and laser light.

While the 3rd generation optical discs that have a high recording density and include a thin covering layer has a large recording capacity, the effect of burst errors is more significant than in the 2nd generation optical discs or the like in spite of the same defect size, for example.

Normally, when recording digital data on an optical disc, an error correcting code (ECC) is added and record encoding processing is performed for easy reproduction. In the case of Blu-ray disc where data is recorded at a high density, complex processing is required for error correction or the like in order to read data accurately.

An error correction block, which is referred to hereinafter as the ECC block, is composed in units of 64-Kbyte user data. Input user data is 2052-byte logical sector where 4-byte error detection code (EDC) is added to 2048-byte user data. The ECC block is composed of 32 logical sectors (code string) and auxiliary data (picket code) that is embedded at regular intervals in order to prevent burst errors (cf. Japanese Unexamined Patent Application Publication No. 2003-242728). The ECC block is then modulated by a modulation mechanism called 1-7PP (Parity Preserve/Prohibit RMTR) modulation to limit run length and recorded on a disc.

The recording data contained in the ECC block of a Blu-ray disc is arranged as shown in FIG. 2. The recording data is not yet been rotated nor constitutes the ECC block together with auxiliary data. This is referred to herein as the recording unit block. If the column direction is a data input sequence (referred to herein as the encoding sequence) when adding EDC, the recording data is recorded on a disc in the row direction.

In Blu-ray discs, 4-byte EDC to be added to 2048-byte user data is calculated by sequentially inputting data (code string) of 2048 bytes added with 4 bytes of 0 data into a shift register in the above encoding sequence to perform a predetermined operation. It is possible to detect an error in the code string composed of the 2048-byte user data and the calculated 4-byte EDC by inputting the code string into the same shift register in the same sequence.

However, since complex interleaving processing is performed so as to accurately reproduce the data that is recorded on a disc with a high density in Blu-ray discs, the code strings are recorded in a different sequence than the encoding sequence, which is referred to herein as the recording sequence. Therefore, the sequence of the read data does not correspond to the sequence of encoding and it is thus impossible to perform processing such as error detection as it is.

For this reason, conventional optical disc apparatus read all the data in one recording unit block, temporarily store it into a buffer, and then read it out in the same sequence as encoding so that the encoding sequence and the error detecting sequence are the same to allow correct operation.

However, the present invention has recognized that the process of loading all code strings (recording unit blocks) contained in the ECC block once into a buffer, rearranging the data in the recording sequence into the encoding sequence and inputting the rearranged data into the shift register to obtain an error detecting value requires an apparatus to have a large buffer memory to store all the data in the recording unit blocks. In addition, memory access that occurs for error detection reduces the throughput of buffer memory access.

SUMMARY OF THE INVENTION

According to an embodiment of the present invention, there is provided an error detector for detecting an error by calculating an error detecting value of a code string added with an error detecting code where a detection target code string to be error-detected contains K (K is a natural number) number of bytes, each byte data being associated with a first sequence, and the error detecting value is obtained when the detection target code string is processed in the first sequence by a predetermined operation method. This error detector includes a substitute value output section outputting a specific substitute value corresponding to the first sequence of each byte data of the detection target code string, and an error detecting value calculation section calculating the error detecting value of the detection target code string according to an output result of the substitute value output section. The error detecting value calculation section calculates the error detecting value by processing each byte data of the detection target code string and the specific substitute value corresponding to the first sequence in a second sequence different from the first sequence.

Since the present invention uses a specific substitute value corresponding to the first sequence of input byte data, it is possible to calculate an error detecting value even if data input sequence is a second sequence.

According to yet another embodiment of the present invention, there is provided a disc apparatus that includes a descrambler generating descrambled code string by descrambling scrambled code string obtained based on each byte data of a code string of K (K is a natural number) number of bytes, each byte associated with a first sequence, and a scramble value corresponding to the first sequence of the byte data, and an error detector detecting an error by calculating an error detecting value of the descrambled code string. Each scramble value corresponding to the first sequence is obtained by performing a predetermined operation corresponding to the first sequence on an initial value. Each byte data of the descrambled code string is associated with the first sequence. The error detecting value is obtained when the descrambled code string is processed in the first sequence with a predetermined operation method. The descrambler includes a scramble value generation section generating a scramble value corresponding to the first sequence of each byte data in the descrambled code string that is input in a second sequence different from the first sequence, and a code string operation section calculating the descrambled data from the input byte data and the scramble value corresponding to the first sequence of the byte data. The error detector includes a substitute value output section outputting a specific substitute value corresponding to the first sequence of each byte data of the descrambled code string, and an error detecting value calculation section calculating the error detecting value by processing each byte data of the descrambled code string and the specific substitute value corresponding to the first sequence in the second sequence according to an output result of the substitute value output section.

Since the present invention uses a specific substitute value corresponding to the first sequence of input byte data, it is possible to calculate an error detecting code addition code string containing an error detecting code even if data input sequence is a second sequence.

According to yet another embodiment of the present invention, there is provided a disc apparatus that includes a descrambler generating descrambled code string by descrambling scrambled code string obtained based on each byte data of a code string of K (K is a natural number) number of bytes, each byte associated with a first sequence, and a scramble value corresponding to the first sequence of the byte data by using the scramble value; and an error detector detecting an error by calculating an error detecting value of the descrambled code string. Each scramble value corresponding to the first sequence is obtained by performing a predetermined operation corresponding to the first sequence on an initial value. Each byte data of the descrambled code string is associated with the first sequence. The error detecting value is obtained when the descrambled code string is processed in the first sequence with a predetermined operation method. The descrambler includes a scramble value generation section generating a scramble value corresponding to the first sequence of each byte data in the descrambled code string that is input in a second sequence different from the first sequence, and a code string operation section calculating the descrambled data from the input byte data and the scramble value corresponding to the first sequence of the byte data. The error detector includes a substitute value output section outputting a specific substitute value corresponding to the first sequence of each byte data of the descrambled code string, and an error detecting value calculation section calculating the error detecting value by processing each byte data of the descrambled code string and the specific substitute value corresponding to the first sequence in the second sequence according to an output result of the substitute value output section.

Since the present invention uses a specific substitute value corresponding to the first sequence of input byte data, it is possible to calculate an error detecting code regardless of data input sequence. Further, since the present invention generates a scramble value corresponding to the first sequence of input byte data, it is possible to perform descrambling operation on the input data that is input in the second sequence different from the first sequence and to calculate an error detecting value in the second sequence.

As described above, the present invention processes data in a predetermined sequence, thereby allowing addition of an error detecting code to the data that enables calculation of an error detecting value even when the data is processed in a different sequence from the predetermined sequence and allowing detection of an error.

BRIEF DESCRIPTION OF THE DRAWINGS

The above and other objects, advantages and features of the present invention will be more apparent from the following description taken in conjunction with the accompanying drawings, in which:

FIG. 3 is an enlarged view of two code strings (D0, D1);

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

A specific embodiment of the present invention is described hereinafter in detail with reference to the drawings. The embodiment applies the present invention to an optical disc reproducing unit with improved processing performance particularly in descrambling and in error detection calculation. It is suitably applicable to an optical disc reproducing unit where an encoding sequence when adding an error detecting code to user data and a recording sequence when recording the user data added with the error detecting code on an optical disc are different.

The following embodiment takes a Blu-ray disc as an example of an optical disc where the encoding sequence and the recording sequence are different; however, the disc is not limited to a Blu-ray disc but may be media such as another optical disc and magnetic optical disk. The present invention is thus also applicable to data processing that writes or reads specific data that can be reversibly calculated and obtained by performing a predetermined calculation on a predetermined sequence of data to or from a medium. Though the following embodiment takes a reproducing unit as an example, it is obvious that the present invention may be also applied to a recording unit or a recording/reproducing unit.

1. Optical Disc Reproducing Unit

Figure 1:
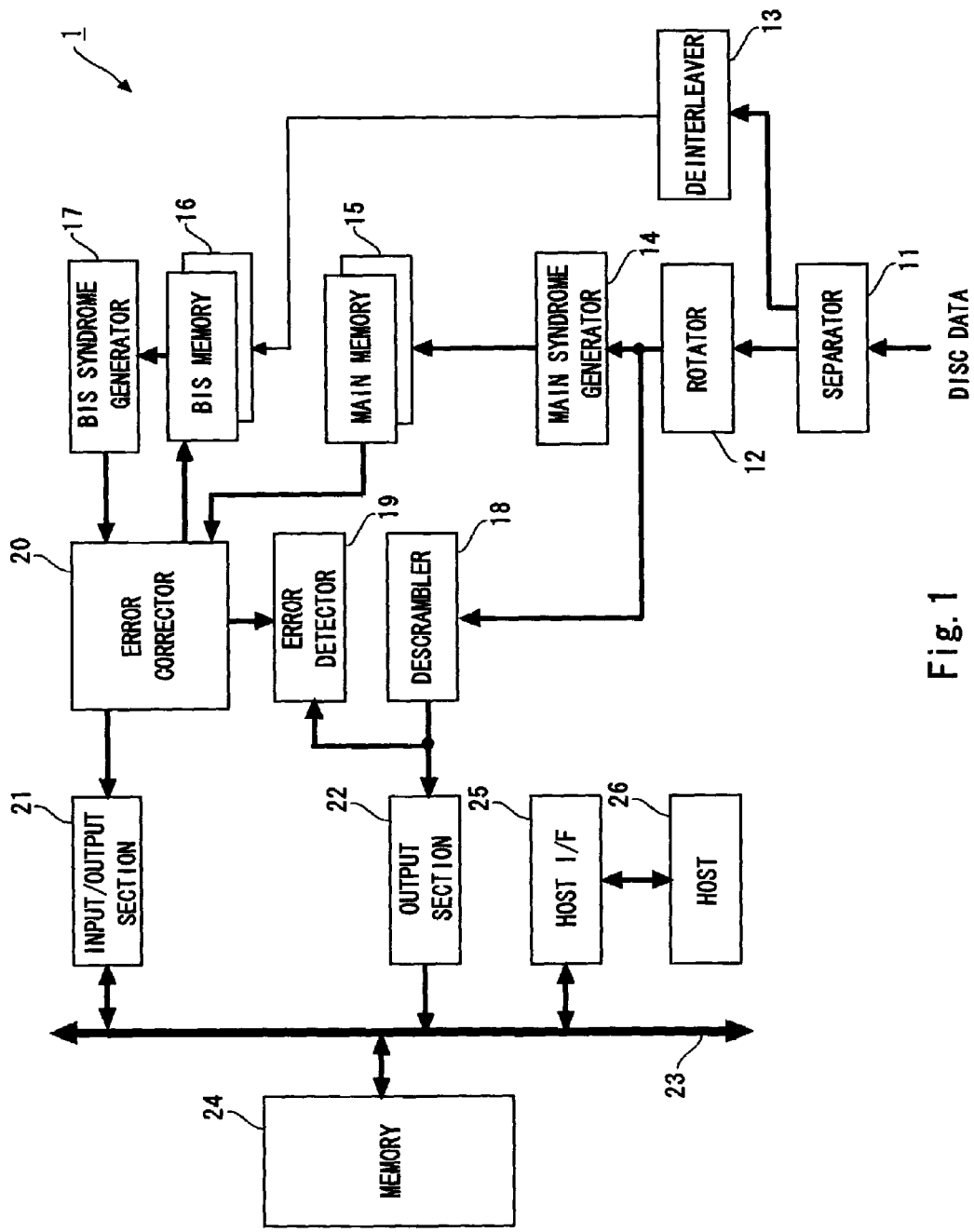
FIG. 1 is a block diagram schematically showing a part of a signal processor of a reproducing unit according to an embodiment of the present invention.

FIG. 1 is a block diagram that schematically shows a part of a signal processor of a reproducing unit according to an embodiment of the present invention. The signal processor 1 of the reproducing unit is supplied with demodulated data that is obtained by demodulating the dada read from a disc (not shown). The signal processor 1 includes separator 11 that separates main data and auxiliary data, a rotator 12 that rotates the main data separated by the separator 11, and a deinterleaver 13 that deinterleaves the auxiliary data. It also includes a main syndrome generator 14 that generates a syndrome of the deinterleaved main data, a main memory 15 that stores the syndrome, a BIS memory 16 that stores deinterleaved auxiliary data, and a BIS syndrome generator 17 that generates a syndrome from the auxiliary data. It further includes a descrambler 18 that receives the main data from the rotator 12 and descrambles the data and an error detector 19 that detects an error of the data. The signal processor 1 further includes an error corrector 20 that corrects an error of each data. An input/output section 21 that receives an error position and an error value from the error corrector 20 and an output section 22 that outputs descrambled data are connected to a memory 24 by a bus 23. A host interface 25 is connected to the bus 23 and the data read out through the host interface 25 is transferred to a host 26 such as PC.

In Blu-ray discs, an error correction (ECC) block is error correction encoded in units of 64 Kbyte user data. The ECC block contains a long distance code (LDC) block, which is described later, and auxiliary data called a picket code. The auxiliary data is error corrected by a burst indicator subcode (BIS) so that a burst error can be detected by detecting the error state of the auxiliary data.

User data is read or written in units of 2048 bytes. A 4-byte error check code EDC is added to the user data, so that each logical sector is composed of 2052 bytes. The logical sectors are grouped into 8 sectors, divided into 76 pieces each having 216 bytes, and encoded with a Reed-Solomon code. This data is arranged in an area (LDC) of 38 bytes×496 (496=(2*216)+(2*32)) bytes. Thus, LDC is composed of 304 code words, and each code word is composed of 248 symbols with a code word length including 216 information symbols and 32 parity symbols. The code words are interleaved every 2*2 in the longitudinal direction of the ECC block, thereby constituting an ECC block of 152 bytes×496 bytes.

The data read from the disc is demodulated and supplied to the separator 11 of the signal processor 1 of the optical disc apparatus. The separator 11 separates the read data into the LDC (which is referred to herein as the main data) and aux-iliary data and supplies them to the rotator 12 and the deinterleaver 13, respectively. Since the main data is rotated in the column direction in the ECC block, the rotator 12 sets the 32 logical sectors contained in the ECC block back to the state before rotation and supplies them to the main syndrome generator 14 and the descrambler 18.

The main syndrome generator 14 performs a predetermined calculation on the main data to generate a syndrome and supplies it to the main memory 15 that is implemented by a static random access memory (SRAM), for example. The auxiliary data is deinterleaved by the deinterleaver 13 and stored into the BIS memory 16 that is implemented by a static RAM or the like. It is then supplied to the BIS syndrome generator 17 every code word to generate a syndrome of the auxiliary data. The syndrome of the auxiliary data is supplied to the error corrector 20 to correct the auxiliary data that is stored in the BIS memory 16. If a bust error exists, the main data is corrected based on the information.

On the other hand, the main memory 15 stores the syndrome of the main data. The syndrome is supplied to the error corrector 20 every code word. The error position and error value of the main data stored in the memory 24 is supplied to the input/output circuit 21 to perform error correction.

On the other hand, the main data is descrambled by the descrambler 18 and an error is detected by the error detector 19. Particularly, the descrambler of this embodiment can read the data that is recorded in an sequence different from an sequence of scrambling performed prior to recording (which is referred to herein as the encoding sequence) in a different sequence from the encoding sequence, and perform descrambling in an sequence (referred hereinafter as the processing sequence) that is different from the encoding sequence. Further, the error detector 19 of this embodiment is a circuit to calculate an error detecting value of each code string from the data input in the above processing sequence. Since it is possible to perform descrambling and error detecting value calculation in a different processing sequence from the encoding sequence, there is no need to rearrange the read data into the encoding sequence before processing. This eliminates the need for a buffer for rearranging the sequence, which is a work area used in the memory 24 in FIG. 1.

2. Data Arrangement

Figure 2:
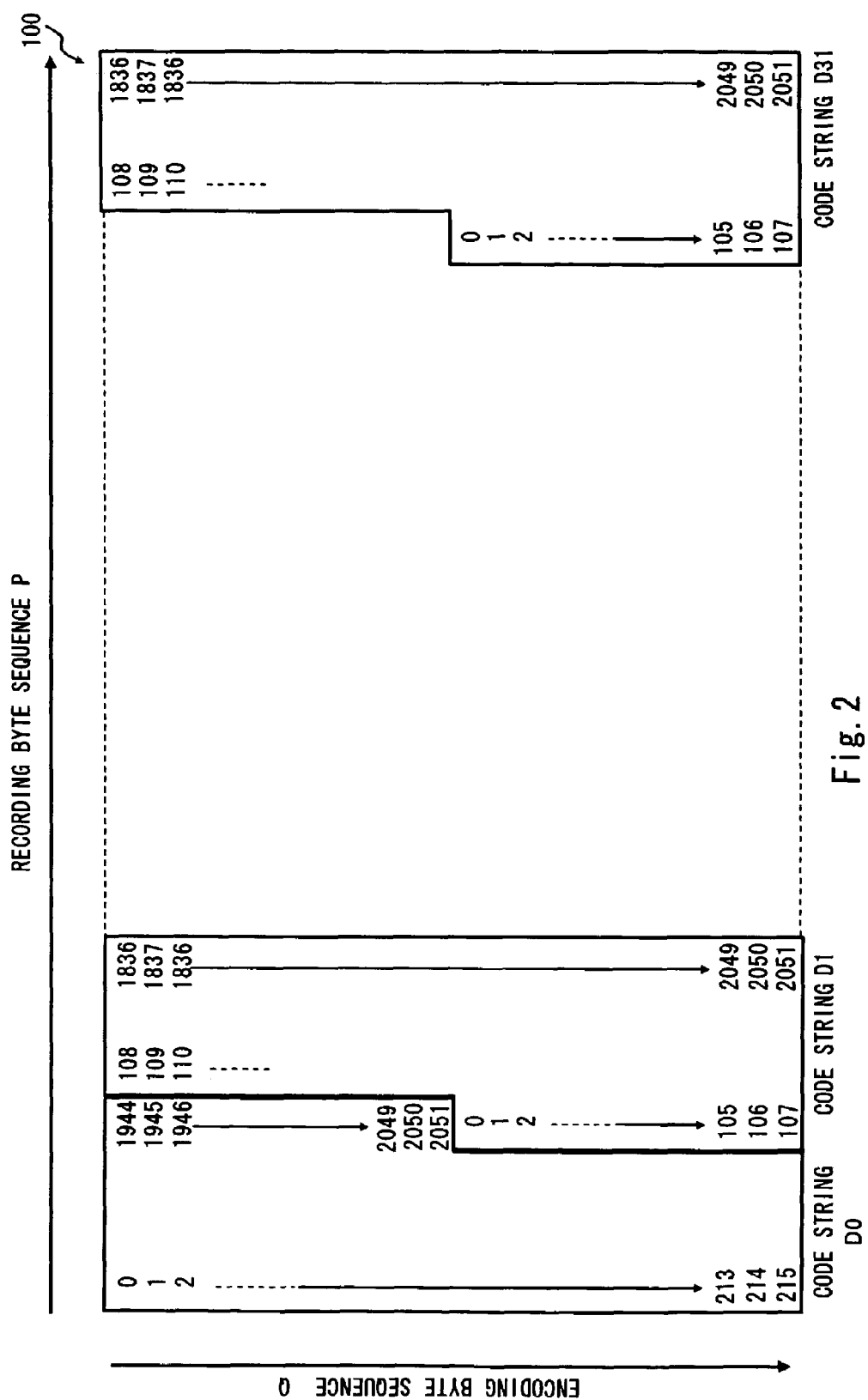
FIG. 2 is a view to describe the arrangement sequence of data in units of bytes contained in a recording unit block of a Blu-ray disc.

The descrambler and error detector in a recording unit of this embodiment are described below. For a start, the arrangement sequence of data of a recording unit block in a Blu-ray disk is described. FIG. 2 is a view to describe the arrangement sequence of data in units of bytes (referred to herein as the byte data) contained in a recording unit block of a Blu-ray disc. FIG. 2 shows the data structure that is after separating auxiliary data from the ECC block of a Blu-ray disc by the separator 11 of FIG. 1 and derotating the main data. In the following description, the data of 2052.times.32 bytes shown in FIG. 2 is referred to as the recording unit block. The recording unit block 100 is composed of 32 code strings (sectors) D(x), which are also referred to herein as D0 to D31. One code string D(x) is composed of 2052-byte data where 4-byte EDC code is added to 2048-byte user data. FIG. 3 is an enlarged view of two code strings (D0, D1). The values shown therein indicate the sequence of descrambling (encoding sequence) in units of bytes. The recording unit block contains 304 columns and 216 byte rows. In FIG. 3, N indicates a column number (0.1toreq.N.1toreq.303) and M indicates a row number (0.1toreq.M.1toreq.215).

In the code string D(x), 216 bytes are arranged in a column and successively in the next column. Thus, for example, N=9th column has 1944th to 2051st byte data of the code string D0, which occupies M=0th to 107th rows. The M=108th to 215th rows in the N=9th column are occupied with 0th to 107th byte data of the next code string D1. In this way, the recording unit blocks are arranged so that an even number code string and an odd number code string forms one unit (code string set). In other words, the data is arranged repeatedly in the same sequence in every two code strings composed of 19 columns.

The code strings D0 to D31 are scrambled by performing a predetermined calculation in the encoding sequence shown in FIGS. 2 and 3 to form the ECC block and recorded on a disc. When recording, the data in the recording unit block is recorded in the row direction indicated by the arrow in FIG. 2, which is perpendicular to the column direction as the encoding direction.

The byte sequence in the column direction in FIGS. 2 and 3 is the encoding sequence. In this specification, the byte data in the column direction is associated with the encoding byte sequence (first sequence) Q that is shown with numerical values in FIGS. 2 and 3. The encoding byte sequence Q is the encoding sequence. Further, the sequence of data in units of bits is referred to as the encoding bit sequence q according to need. In the recording unit block where the byte data of this sequence is arranged in an array of columns and rows, the byte sequence in the row direction is the sequence of recording data on a disc. In this specification, the byte data in the row direction is shown in the recording byte sequence (second sequence) P. The encoding byte sequence Q represents the processing sequence of original descrambling processing and error detection processing in a Blu-ray disc. The recording byte sequence P represents the sequence of recording data on a Blu-ray disc, which represents the processing sequence of descrambling processing and error detection processing in this embodiment. Thus, while this embodiment performs recording and reproduction of data on a disc in the same sequence as the recording byte sequence P in a normal Blu-ray disc, it performs descrambling and error detection in a different sequence from the conventional encoding byte sequence (=Q). This embodiment makes the sequences of descrambling and error detection processing the same as the recording byte sequence P, thereby eliminating the need to load the read data once into a buffer and rearrange it so that the data can be processed as it is.

Figure 4:
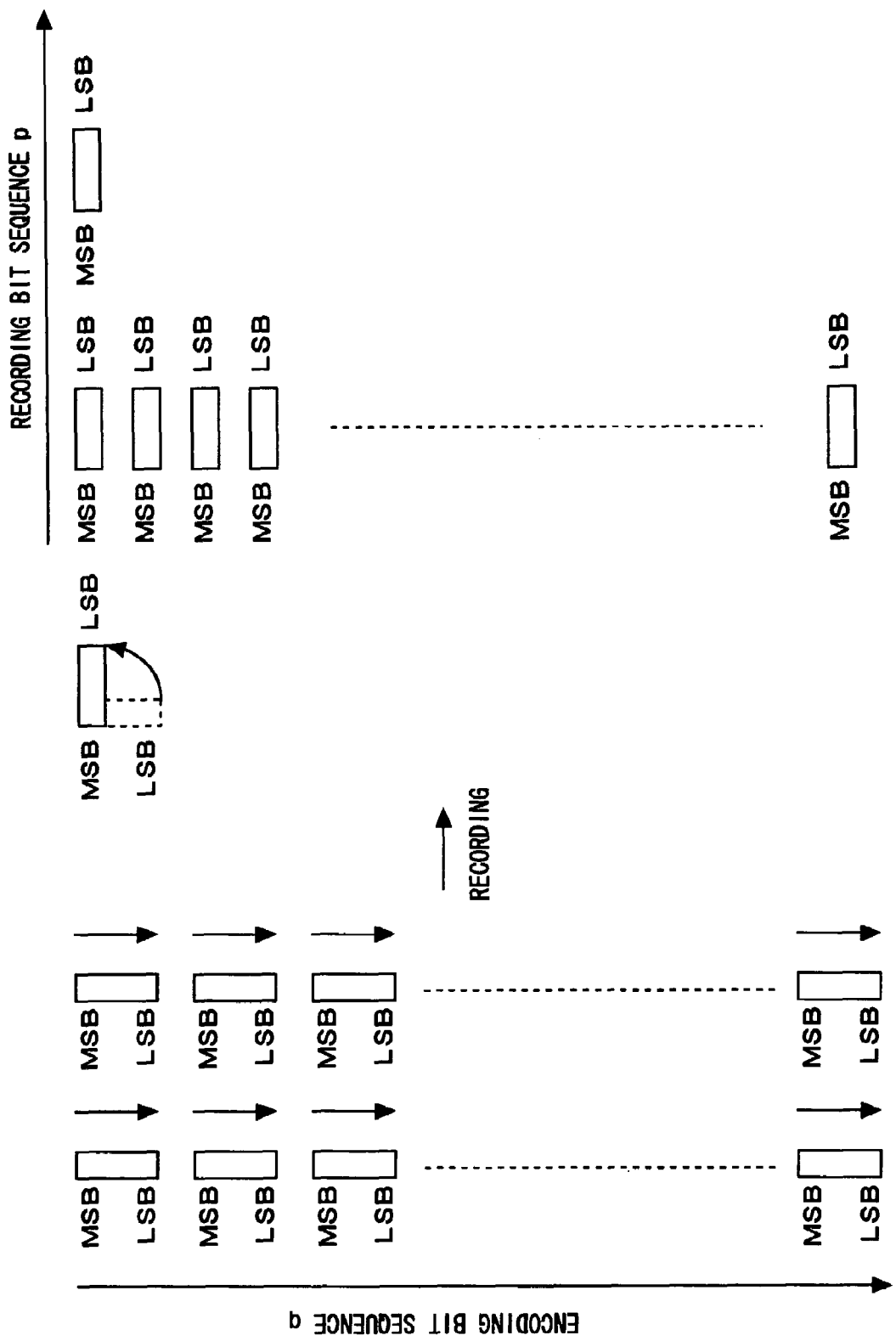
FIG. 4 is a pattern diagram to describe the arrangement sequence of bits of byte data in the encoding direction and recording direction.
Figure 13:
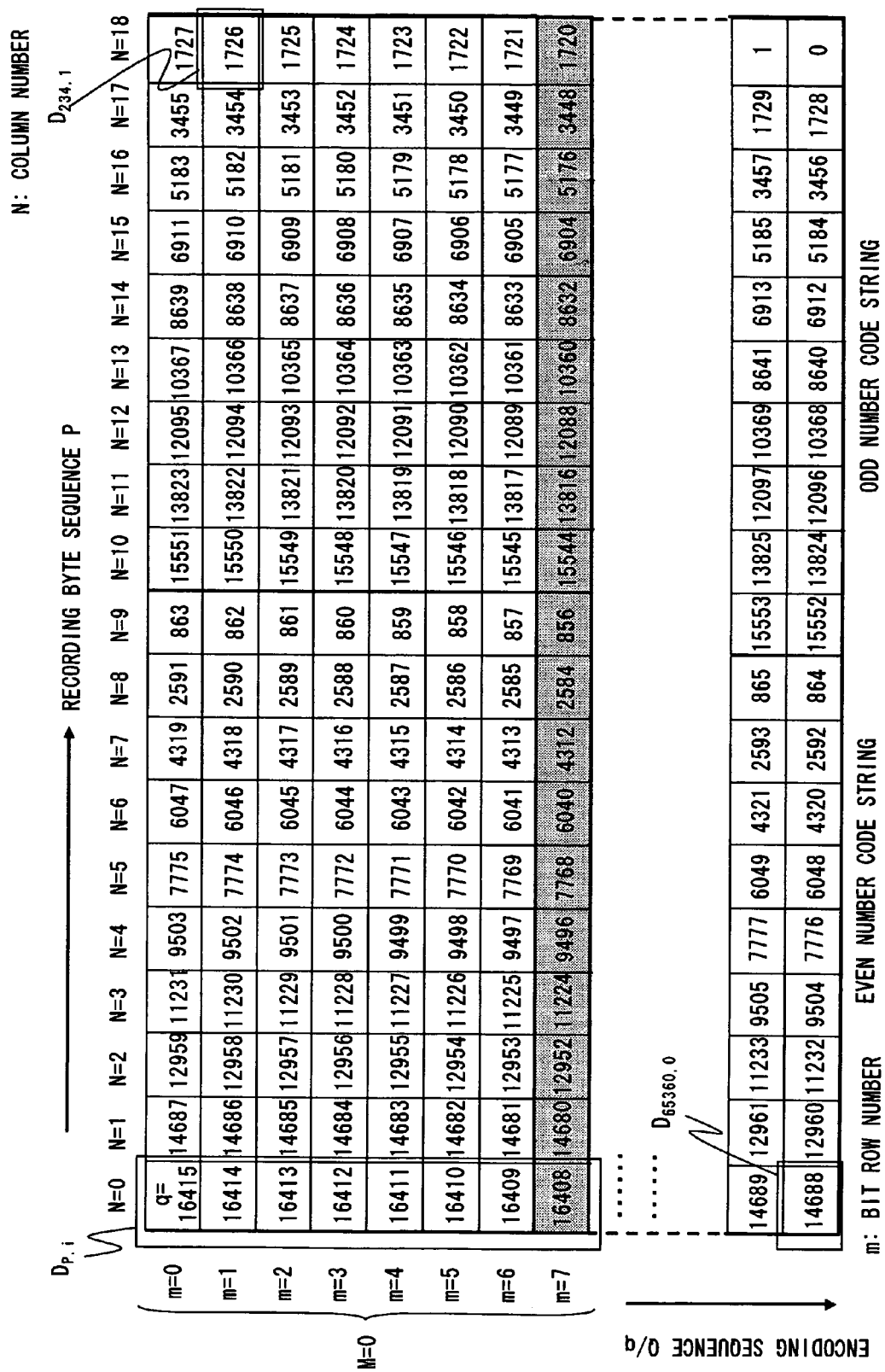
FIG. 13 is an enlarged view of two code strings (D0, D1)

FIG. 4 is a pattern diagram to describe the arrangement sequence of bits contained in byte data in the encoding direction and recording direction. As shown in FIG. 4, one byte data in the encoding byte sequence Q in the column direction contains the most significant bit MSB to the least significant bit LSB in an encoding bit sequence q. When the recording unit block is viewed in units of bits, one byte data in the recording direction corresponds to 8-bit data in the encoding direction as shown in FIG. 13. Thus, when recording the data in the encoding byte sequence Q or the encoding bit sequence q, the data is arranged in a recording bit sequence p as shown in the right part of FIG. 4. The MSB to LSB of each byte data in the recording direction thus correspond to MSB to LSB of each byte data in the encoding direction. The bit data in the recording direction is associated with the recording bit sequence p in this specification.

The descrambling processing in this embodiment is performed in units of bytes along the byte sequence in the row direction (recording byte sequence P). The encoding byte sequence Q is associated with one encoding column to satisfy $0 \leq Q \leq 2051$. The recording byte sequence P is associated with one recording unit block to satisfy $0 \leq P \leq 65663$.

3. Descrambler

Since the data recorded on a disc is read in the sequence of recording, the read data is in a sequence different from the encoding sequence Q. However, since the scrambling is the processing that is descrambled by performing a predetermined operation on data in the encoding sequence Q, it is unable to descramble the data with a predetermined operation performed in the reading sequence P. This embodiment proposes an arithmetic circuit and method for descrambling data even when the data is processed in the recording sequence P that is different from the encoding sequence Q.

First, descrambling processing is described to facilitate understanding of the present invention. The same method may be used both when scrambling and descrambling a code string. When scrambling data, mod 2 addition (exclusive-OR operation) of 8-bit input data $D_i$ and 8-bit scrambled data (scramble value) $S_i$ that is generated in a scrambler gives scrambled data $DS_i$ as shown in the following expression:

$$DS_i = S_i + D_i \quad \text{Expression 1}$$

where "+" indicates exclusive-OR operation EOX (XOR). The symbol "+" indicates XOR operation in the following description also.

Similarly, when descrambling data, mod 2 addition of scrambled input data $D_i$ and 8-bit scramble value $S_i$ that is generated in a scrambler produces descrambled data $DS_i$. The scramble value $S_i$ corresponds to the input data $D_i$ in both cases. The following description describes descrambling.

Figure 5:
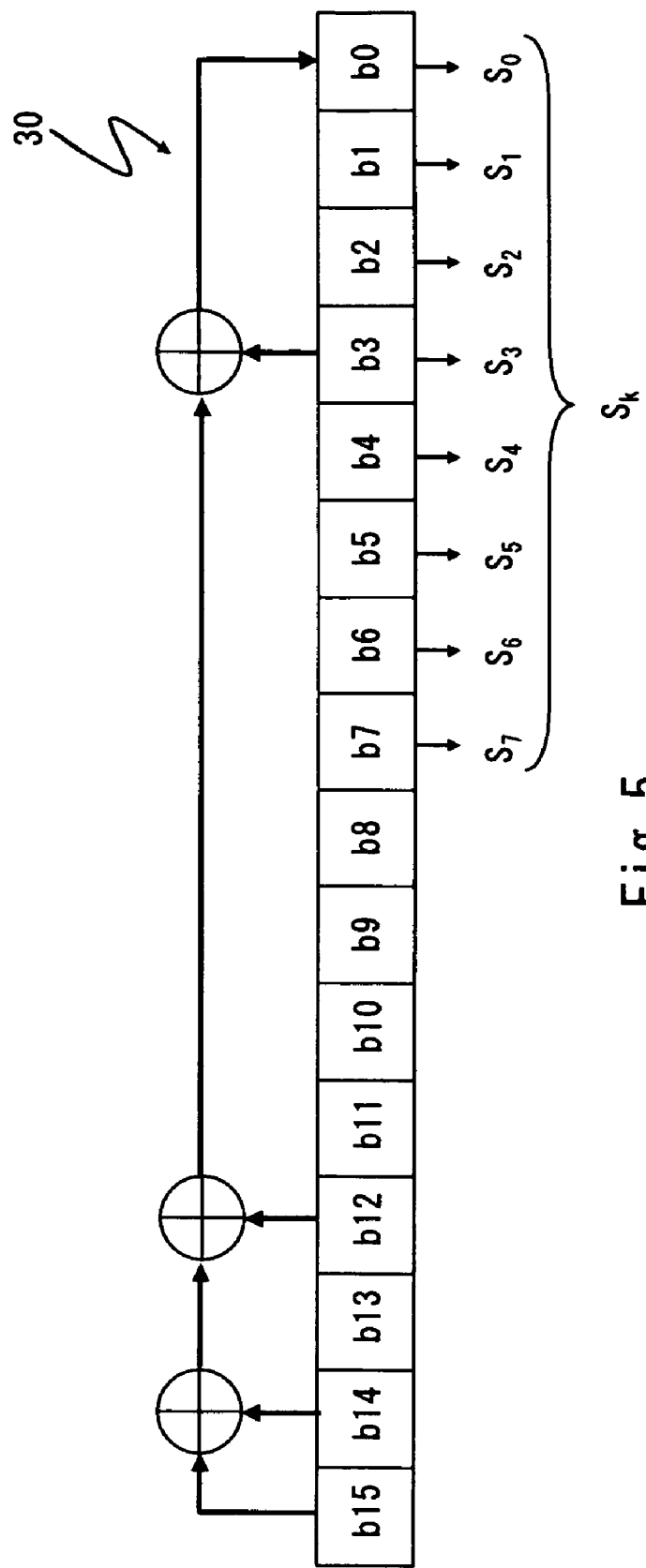
FIG. 5 is a view showing a shift register as a scrambler to generate scrambled data Si.

FIG. 5 shows a shift register as an example of a scrambler to generate scrambled data S.sub.i. The shift register 30 shown in FIG. 5 is initialized to a predetermined value. The XOR operation on the value S.sub.i of b7 to b0 after i-times shifting and the input data D.sub.i produces descrambled data DS.sub.i. Thus, obtaining the descrambled data DS.sub.i requires obtaining the scramble value S.sub.i.

The data contained in the recording unit block shown in FIGS. 2 and 3 is read in the row direction (recording direction) of the recording unit block. The data is input to the descrambler in the recording byte sequence P. Therefore, the operational expression of the above expression 1 is as follows:

$$DS_i = S_i + D_i \quad \text{Expression 2}$$
$$= S(P*216) \bmod 2052 + D_i$$

If the recording byte sequence P (descrambling sequence) input to the descrambler and the encoding byte sequence Q are the same, the scramble value $S_i$ can be obtained by shifting the shift register 30 once for each data input clock. On the other hand, if the input data is input in the recording byte sequence P that is the descrambling sequence different from the encoding byte sequence Q, the scramble value $S_i$ cannot be obtained by simply shifting the shift register 30. As shown in FIG. 3, the recording byte sequence P is: $D_{Q=0} \rightarrow D_{Q=216} \rightarrow D_{Q=432} \rightarrow D_{Q=648}$ and so on. Therefore, a shift register value (scramble value) to be output from the shift register 30 is: a value shifted 0 times→a value shifted 216 times→a value shifted 432 times, and so on. Hence, if M=row (Row: 0 to 303) and N=column (Column: 0 to 215), a scramble value to be output when data is input in the recording byte sequence P is a value shifted $((216*N) \bmod 2052+M)$ times. This means that it is necessary to shift the shift register 30 216 times for each input of 1-byte data. This requires 216 clocks for each calculation, causing a longer descrambling processing time. In order to prevent this, it is necessary to load the entire recording unit block into a buffer once, rearrange the data in the encoding byte sequence Q, and input it into the shift register 30. This requires a storage area such as RAM to load the recording unit block once and deteriorates RAM access performance that can be allocated somewhere else.

To overcome this drawback, this embodiment utilizes the regularity of the encoding byte sequence Q and the recording byte sequence P. It combines two shift registers that can shift data a plurality of times while the shift register 30 shifts data once to calculate a scramble value $S_k$ that is similar to that in the shift register 30 in the recording byte sequence P. This allows performing descrambling of data that is input in a different sequence from the encoding byte sequence Q.

Figure 6:
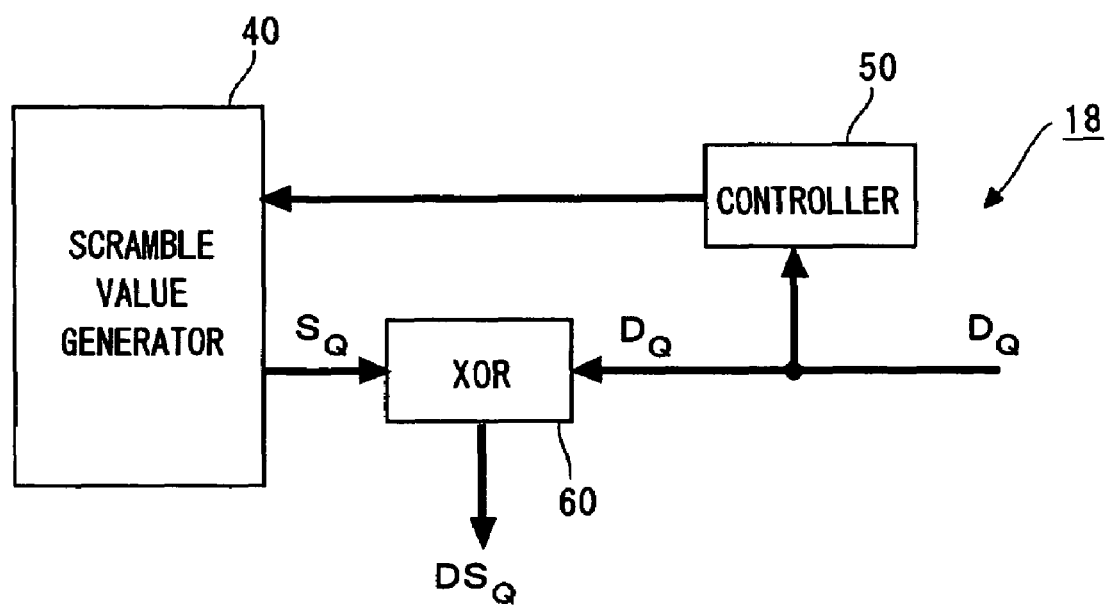
FIG. 6 is a block diagram showing a descrambler in a reproducing unit according to an embodiment of the present invention.

The descrambler 18 receives each data D.sub.Q of the recording unit block in the sequence of reading (reading byte sequence P). As shown in FIG. 6, the descrambler 18 comprises a scramble value generation section (a scramble value generator) 40 that generates a scramble value S.sub.Q to descramble the byte data D.sub.Q in the recording byte sequence P, corresponding to the encoding sequence Q of the scrambled data S.sub.Q that is input in the recording byte sequence P different from the encoding sequence Q; and a logic circuit (referred to herein as XOR) 60 calculates the descrambled data from the scrambled data and the scramble value S.sub.Q corresponding to the encoding sequence Q of the scrambled data. The code string operation section includes a controller 50 and the XOR 60. The controller 50 controls the scramble value generator 40 according to the data D.sub.Q. The XOR 60 outputs data DS.sub.Q that is obtained by performing XOR operation on a scramble value S.sub.Q and input data D.sub.Q and descrambling the result in the recording byte sequence P.

Figure 7:
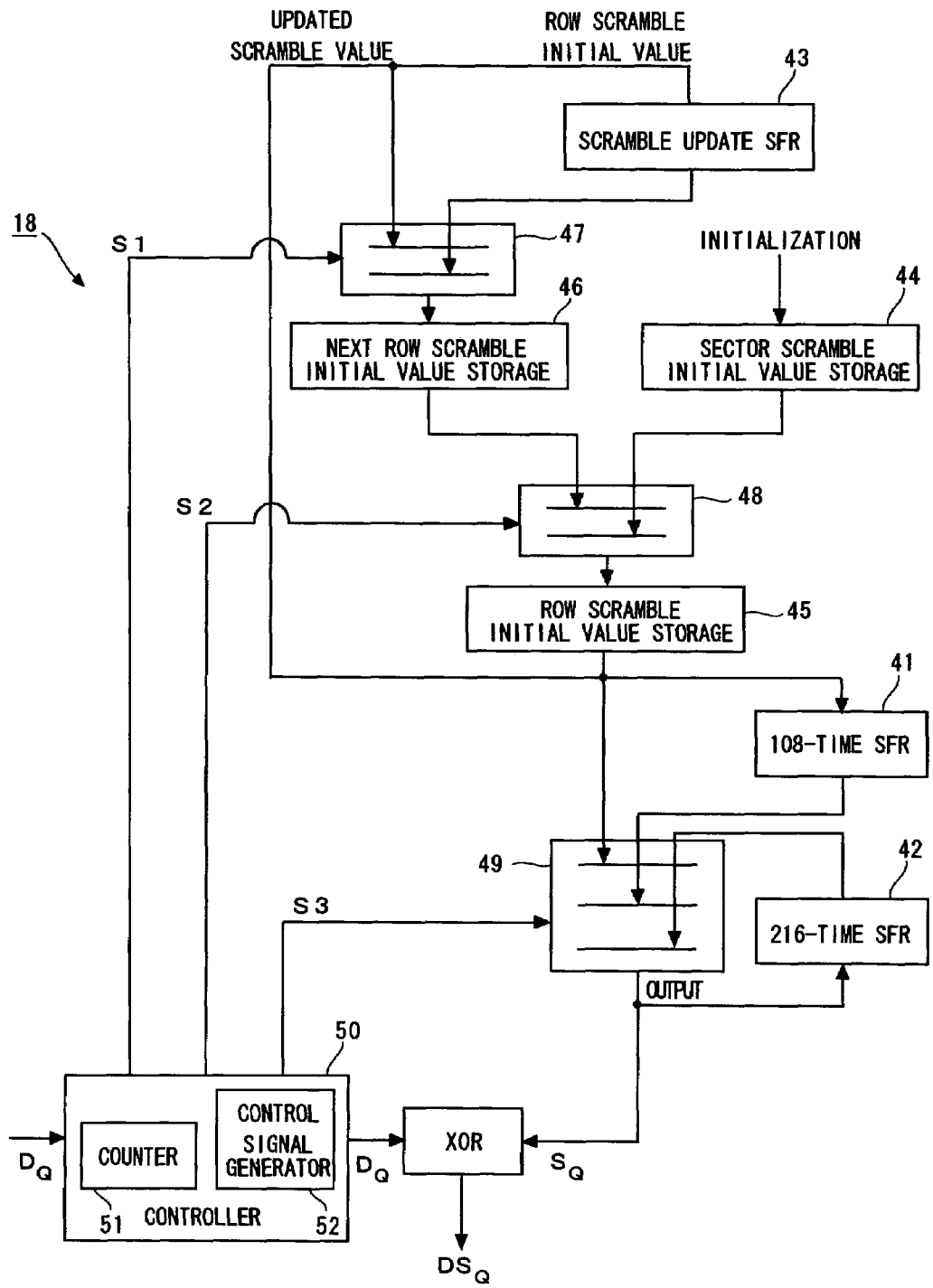
FIG. 7 is a view showing a detail of the descrambler of FIG. 6.

FIG. 6 is a block diagram that shows the descrambler 18 of FIG. 1. FIG. 7 is a view that shows details of the descrambler of FIG. 6. The descrambler 18 generates descrambled data by descrambling scrambled data associated with the encoding sequence Q and scramble value corresponding to the encoding sequence Q by using the scramble value $S_i$. The scrambled data is associated with the encoding sequence Q, and each scramble value corresponding to the encoding sequence Q is obtained by performing a predetermined operation corresponding to the encoding sequence Q on an initial value.

The descrambler 18 receives each data $D_Q$ of the recording unit block in the sequence of reading (reading byte sequence P). As shown in FIG. 6, the descrambler 18 comprises a scramble value generation section (a scramble value generator) 40 generates a scramble value $S_Q$ to descramble the byte data $D_Q$ in the recording byte sequence P, corresponding to the encoding sequence Q of the scrambled data $S_Q$ that is input in the encoding sequence P different from the encoding sequence Q; and a logic circuit (referred to herein as XOR) 60 calculates the descrambled data from the scrambled data and the scramble value $S_Q$ corresponding to the encoding sequence Q of the scrambled data. The code string operation section includes a controller 50 and the XOR 60. The controller 50 controls the scramble value generator 40 according to the data $D_Q$. The XOR 60 outputs data $DS_Q$ that is obtained by performing XOR operation on a scramble value $S_Q$ and input data $D_Q$ and descrambling the result in the recording byte sequence P.

The scramble value generator 40 includes the 108-time SFR 41, the 216-time SFR 42, a scramble update SFR 43, a sector scramble initial value storage 44, a Row scramble initial value storage 45, a Next Row scramble initial value storage 46, and switches 47 to 49. The controller 50 includes a counter 51 that counts the columns and rows of the input data $D_Q$ and a control signal generator 52 that generates a control signal according to a count value of the counter.

The sector scramble initial value storage 44 stores a scramble value $S_0$ that corresponds to Q=0th data $D_{Q=0}$ in one code string. The scramble value $S_0$ is an initial value of the shift register 30 of FIG. 4 that is used for scrambling.

The Row scramble initial value storage 45 stores an initial value that corresponds to the present column (N=0 to 303) and row (M=0 to 215), which is referred to herein as the Row scramble initial value. The scramble update SFR 43 generates an initial value that corresponds to a row next to the present row as an updated scramble value according to the Row scramble initial value. The scramble update SFR 43 has the same configuration as the shift register 30 of FIG. 5, and it is capable of performing the same operation as the one-time shift operation of the shift register 30 in one clock.

The switch 47 receives a control signal S1 from the control signal generator 52, selects one from the Row scramble initial value and the updated scramble value and outputs the selected value. The Next Row scramble initial value storage 46 stores the value selected and output from the switch 47 as a Next Row scramble initial value.

The switch 48 receives a control signal S2 from the control signal generator 52, selects one from the sector scramble initial value and the Next Row scramble initial value, and outputs the selected value. The Row scramble initial value storage 45 stores the value selected and output from the switch 48 as a present Row scramble initial value.

The 108-time SFR 41 receives the present Row scramble initial value and outputs a value after shifting this value 108 times. The 216-time SFR 42 outputs a value after shifting a scramble value $S_{Q-1}$ in the previous data $D_{Q-1}$ 216 times. The switch 49 receives a control signal S3 from the control signal generator 52, selects one from the present Row scramble initial value, the value shifted 108 times and the value shifted 216 times, and outputs the selected value as a scramble value $S_Q$.

The counter 51 increments a column count value N from 0 to 303 each time data $D_Q$ is input. Then, at the timing when the column count value N changes from 303 to 0, the counter 51 increments a row count value M from 0 to 215. The timing when the row count value M changes from 215 to 0 is a processing end timing of one recording unit block.

The control signal generator 52 shifts the scramble update SFR 43 once at a timing one clock prior to the timing when the row count value M is incremented according to the control signal S1. The scramble update SFR 43 thereby updates the scramble value in the N=0th column corresponding to the present row to the scramble value (updated scramble value) corresponding to the next row. The operation is detailed later.

Further, the control signal generator 52 outputs a control signal S2 to control the switch 48 so as to select and output a sector scramble initial value $S_0$ when (N mod 19)=9 and (M mod 216)=108 or when (N mod 19)=0 and (M mod 216)=0 and select a Next Row scramble initial value and output a stored value at other timings.

Further, the control signal generator 52 outputs a control signal S3 to control the switch 49 to select the Row scramble initial value storage 45 when (N mod 19)=0, selects the 108-time SFR 41 when (N mod 19)=10 and M=0 to 107 and when (N mod 19)=9 and M=108 to 215, and select the 216-time SFR 42 at other timings and output the selected value.

Figure 8:
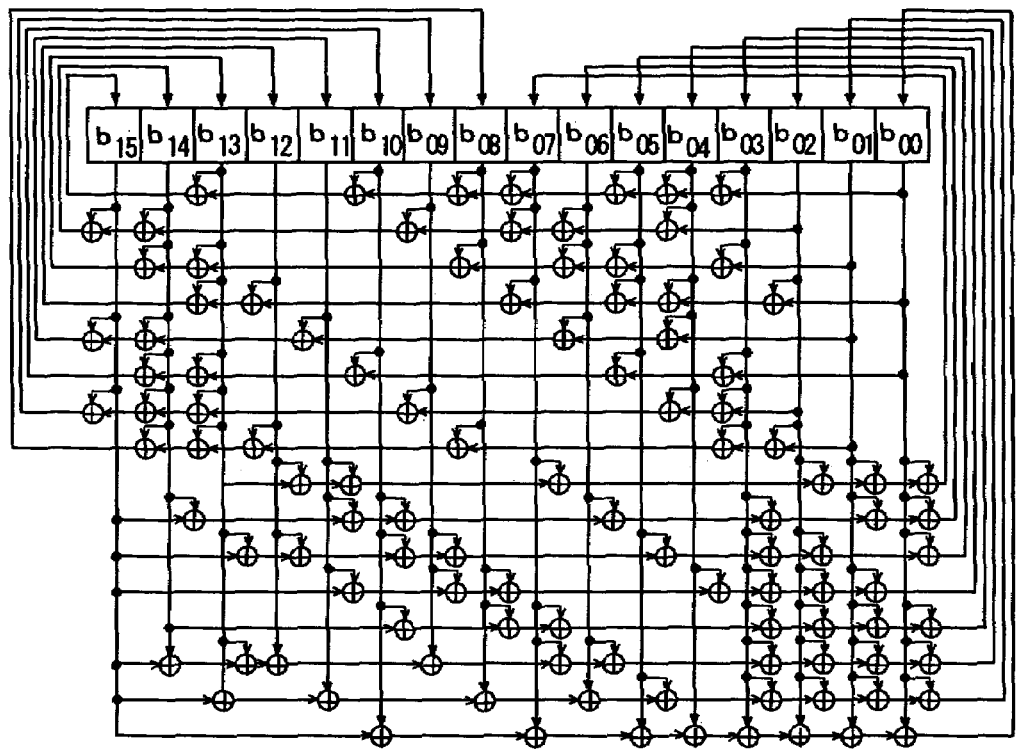
FIG. 8 is a circuit diagram showing a 108-time SFR 41 in the descrambler of FIG. 7.
Figure 9:
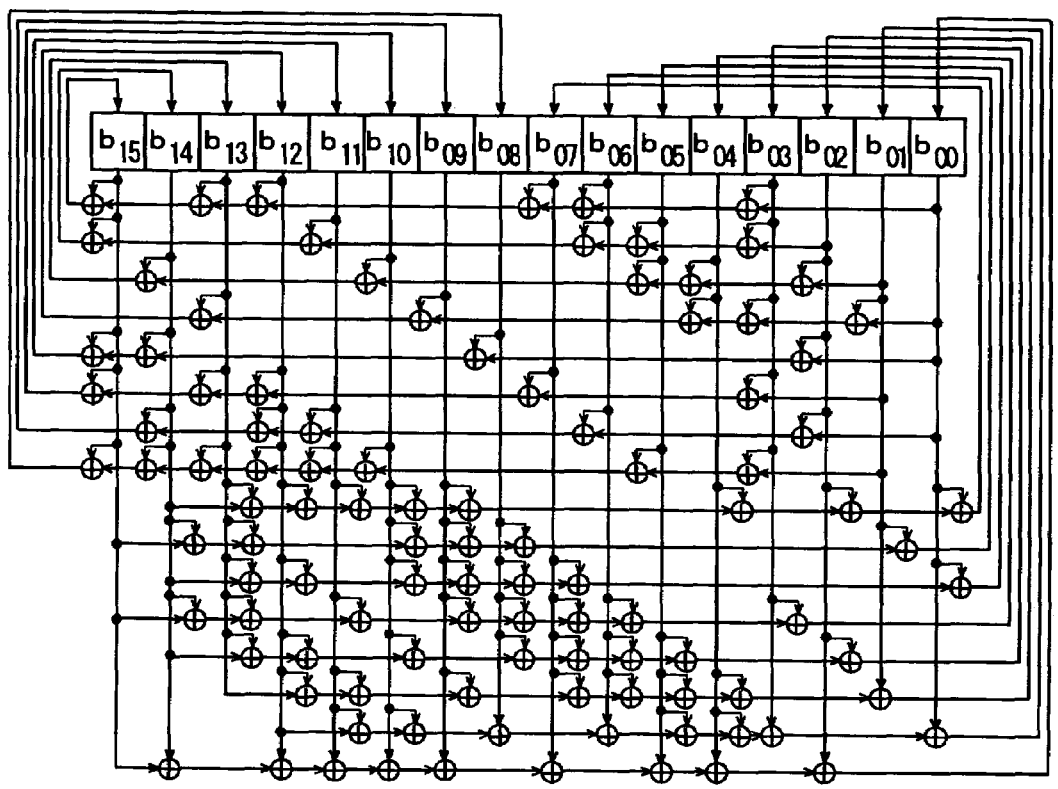
FIG. 9 is a circuit diagram showing a 216-time SFR 42 in the descrambler of FIG. 7.

FIG. 8 shows the 108-time SFR 41 and FIG. 9 shows the 216-time SFR 42. Shown in the upper parts of FIGS. 8 and 9 are the circuit diagrams of the 108-time SFR 41 and the 216-time SFR 42, respectively. Shown in the lower parts of FIGS. 8 and 9 are arithmetic expressions of bits $b_0$ to $b_{15}$ that are stored in the registers of the 108-time SFR 41 and the 216-time SFR 42, respectively. The 108-time SFR 41 and the 216-time SFR 42 are both parallel SFR of 16 bits ($b_0$ to $b_{15}$) and output the values equivalent to the values shifted 108 times and 216 times, respectively, in the shift register 30 of FIG. 5. The shift register 30 is obtained by the following polynomial:

$$\phi(x)=X^{16}+X^{15}+X^{13}+X^4+1 \quad \text{Expression 3}$$

where X represents an element when the shift register is represented by generating polynomial. The arithmetic expressions for shift operation of 108 times and 216 times shown in the lower parts of FIGS. 8 and 9, respectively, are given from the polynomial $\phi(x)$. The 108-time SFR 41 and the 216-time SFR 42 are shift registers to execute the arithmetic expressions.

4. Descrambling Process

Figure 10:
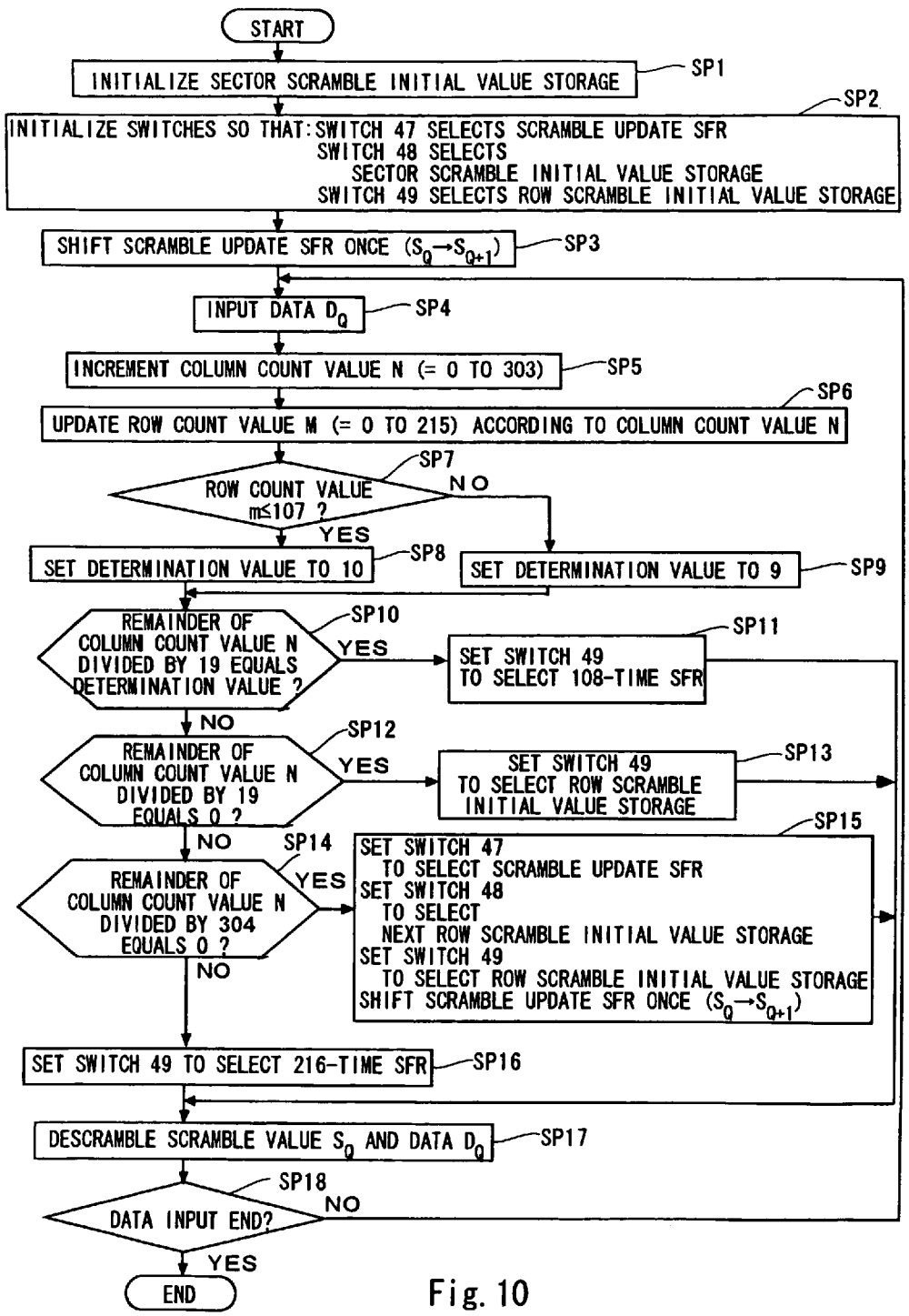
FIG. 10 is a flowchart showing a descrambling process in a reproducing unit according to an embodiment of the present invention.

A descrambling process of the descrambler shown in FIG. 7 is described below. FIG. 10 is a flowchart that shows the descrambling process according to this embodiment. As shown in FIG. 10, the process first initializes the sector scramble initial value storage 44 to store a scramble value $S_0$ (Step SP1). Then, it initializes all the switches 47 to 49 by control signals S1 to S3 (Step SP2). By the initialization, the switch 48 selects the output of the sector scramble initial value storage 44 to output a scramble initial value $S_0$. Further, the switch 49 selects the output of the Row scramble initial value storage 45 to output a Row scramble initial value. Further, the switch 47 selects the output of the scramble update SFR 43. Since the switch 48 selects the sector scramble initial value storage 44, the value of the scramble update SFR 43 is not selected nor output.

By the selection of each switch, the scramble update SFR 43 that has the same configuration as in FIG. 5 receives a sector scramble initial value $S_0$. The scramble update SFR 43 generates an update scramble value (scramble value S1) that is a value after shifting the sector scramble initial value $S_0$ once (Step SP3). The update scramble value is selected only at the timing when a row count value M is incremented. The process then repeats Steps SP4 to SP18, so that the scramble value generator 40 outputs a scramble value $S_Q$ that corresponds to input data $D_Q$ and then outputs data $DS_Q$ that is obtained by descrambling the scramble value $S_Q$ and the input data $D_Q$ in the sequence of inputting the input data $D_Q$.

Then, byte data $D_Q$ is input (Step SP4) and a column count value N is incremented (Step SP5). The input byte data $D_Q$ is $D_{Q=0}$ to $D_{Q=65663}$ and 1-byte data in the recording byte sequence P is input in one clock. When the first data $D_{Q=0}$ of the recording unit block 100 is input, the counter sets a column count value N and a row count value M to 0 and starts counting. The column count value N is counted up from 0 to 303 (Step SP5). Then, the row count value M is updated according to the value of the column count value N. The row count value M is incremented only at the timing when the column count value N turns from 303 to 0 and counted up to 215. Then, the process determines which row the input byte data $D_Q$ belongs to. When the row count value M is equal to or less than 107 (Yes in Step SP7), a determination value H1 is set to 10 (Step SP8). On the other hand, when the row count value M is greater than 107 (No in Step SP7), a determination value H2 is set to 9 (Step SP9). The process further determines whether a remainder after dividing the column count value N by 19 (N mod 19) is the determination value H1 or H2 (Step SP12).

If the (N mod 19) is the determination value H1 or H2 (N=9, 10, 28, 29, . . . 294, 295), that is, if data $D_Q$ in the last column of the even number code string adjacent to the odd number code string or the first column of the odd number code string adjacent to the even number code string is input, the switch 49 selects the output of the 108-time SFR 41 by the control signal S2 (Step SP11). On the other hand, if a remainder after dividing the column count value N by 19 is 0, (Step SP12), that is, if the data in the first column of the even number code string is input, the switch 49 outputs the Row scramble initial value by the control signal S2 (Step SP13).

Further, if the column count value N=0, that is, if a remainder after dividing the column count value N by 304 is 0 (Step SP14), the switches 47 to 49 make the following selections and the scramble update SFR 43 shifts a value once (Step SP15). Specifically, the switch 47 selects the output of the scramble update SFR 43 to output an updated scramble value to the Next Row scramble initial value storage 46. The switch 48 selects the output of the Next Row scramble initial value storage 46 to output an updated scramble value to the Row scramble initial value storage 45. Further, the switch 49 selects the output of the Row scramble initial value storage 45 to output an updated scramble value through OUTPUT.

As described above, at the timing when the column count value N becomes 0 or when the row count value M is incremented, the updated scramble value from the scramble update SFR 43 is output from the OUTPUT through the switch 47, the Next Row scramble initial value storage 46, the switch 48, the Row scramble initial value storage 45, and the switch 49. Then, the scramble update SFR 43 shifts an updated scramble value that corresponds to the present row once to generate an updated scramble value that corresponds to the next row. The scramble update SFR 43 shifts the sector scramble initial value ($S_0$) that is supplied from the sector scramble initial value storage 44 firstly each time the row count value M is incremented, thereby generating scramble value $S_0 \rightarrow S_1 \rightarrow \ldots S_{214} \rightarrow S_{215}$ from the 1st to 215th rows in the 0th column shown in FIG. 3.

Then, if a remainder after dividing the column count value N by 19 is not 0, 9, or 10 nor N=0, the switch 49 selects the 216-time SFR 42 to shift the previous value 216 times and output the shifted value through the OUTPUT (Step SP16). A scramble value $S_Q$ is thereby output from OUTPUT. Then, the XOR 60 performs XOR operation for descrambling on the scramble value $S_Q$ and the data $D_Q$, thereby outputting descrambled data $DS_Q$ from the descrambler 18 (Step SP17). If next data $D_Q$ is input, the process is repeated from Steps SP4.

By the above series of operations, the scramble value S.sub.Q that corresponds to the input data D.sub.Q is output through the OUTPUT. Specifically, if the first data D.sub.Q=0 of the recording unit block is input, the scramble value S.sub.0 from the sector scramble initial value storage 44 is output from the OUTPUT through the switch 48, the Row scramble initial value storage 45, and the switch 49. After that, a scramble value S.sub.Q that corresponds to the input data D.sub.Q is output by switching the switches 47 to 49 appropriately. The output scramble value S.sub.Q is input to the XOR 60. The XOR 60 performs XOR operation on the scramble value S.sub.Q with the data D.sub.Q, thereby outputting descrambled data DS.sub.Q.

The above descrambling process is described in detail below about the case where the data $S_Q$ shown in FIG. 3 is sequentially input from $D_{Q=0}$. As described above, upon input of the data $D_{Q=0/P=0}$ ($D_{Q/P}$: data of encoding byte sequence Q/recording byte sequence P), an initial value $S_0$ of the sector scramble initial value storage 44 is latched by the Row scramble initial value storage 45, selected by the switch 49, and output through the OUTPUT. At the same time, the initial value $S_0$ is supplied to the 216-time SFR 42. After one clock when the next data $D_{Q=216/P=1}$ is input, the process calculates a value $S_{216}$ that is a value of $S_0$ shifted 216 times and outputs the result. The switch 49 selects the output of the 216-time SFR 42 in the timings different from when (N mod 19)=10 and M=0 to 107 and when (N mod 19)=9 and M=108 to 215, and when (N mod 19)=0. In other words, it selects the output of the 216-time SFR 42 and outputs the selected value through the OUTPUT during the processing period of the byte data in the same column and the same code string until the column counter value N reaches 9 after the data $D_{Q=0}$ is input.

The OUTPUT thereby sequentially outputs the value that is $S_0$ shifted 216 times ($S_0 \rightarrow S_{216} S_{432} \rightarrow \ldots \rightarrow S_{1944}$ ($S_{(N^*216) \bmod 2052}$)). Then, upon input of data $D_{Q=108/P=10}$ where N=10 and M=0, the switch 49 selects the output of the 108-time SFR 41. The switch 49 selects the output of the 108-time SFR 41 in the timings when (N mod 19)=10 and M=0 to 107 and when (N mod 19)=9 and M=108 to 215, that is, the timing of processing the byte data changing from one code string to the next code string in the same row. The 108-time SFR 41 outputs the output of the Row scramble initial value storage 45, which is $S_{108}$ that is $S_0$ shifted 108 times in this case. It is thereby possible to output an appropriate scramble value when the input data $D_Q$ changes from $D_{Q=1944/P=9}$ to $D_{Q=108/P=10}$ where N=9→N=10. The switch 49 is then switched to select the output of the 216-time SFR 42. The value $S_{108}$ that is output through the OUTPUT is supplied to the 216-time SFR 42 also, and the value of $S_{108}$ shifted 216 times is output in N=11 to 18 after that ($S_{108} \rightarrow S_{324} \rightarrow \ldots \rightarrow S_{1836}$).

Then, upon input of the data (N mod 19)=0 when the column count value N=19, the data $D_{Q=0/P=19}$ is input again. At this timing, the switch 49 selects the output of the Row scramble initial value storage 45. Since the Row scramble initial value storage 45 stores the initial value $S_0$ as described above, the value $S_0$ is output through the OUTPUT. It is thereby possible to output an appropriate scramble value $S_Q$ through the OUTPUT even when the number of shifting times changes from $D_{Q=1836/P=18}$ to $D_{Q=0/P=19}$. After that, the same operation is repeated in the processing on the same row of M=0.

Then, upon input of the 305th data $D_{Q=304}$ (N=0, M=1) when the row count value M changes from 0 to 1, the selection of the switches 47 and 48 is changed. This value is fixed as follows until the 0th data in the next recording unit block is input. Specifically, the switch 47 is switched to select the output of the scramble update SFR 43 from the Row scramble initial value storage 45. The switch 48 is switched to select the output of the Next Row scramble initial value storage 46.

By this switching, a value S1 that is the initial value $S_0$ shifted once in the scramble update SFR 43 is stored in the Next Row scramble initial value storage 46. This value is then stored in the Row scramble initial value storage 45 by the next clock and output from the OUTPUT through the switches 48 and 49. This process requires two clocks. Since two clocks are required until $S_1$ is output, the switch 47 is switched to the scramble update SFR 43 at the timing of inputting data byte in the column (N=302) immediately before the last column which is one clock before the timing that the row count value M turns from 0 to 1, and the switch 48 selects the Next Row scramble initial value storage 46 at the timing of inputting data byte in the last column (N=303). The value $S_1$ that is stored in the Row scramble initial value storage 45 is output from the OUTPUT through the switch 49 at the timing of inputting the data byte at the top of the next row (row count value M=0, $D_{Q=1/P=304}$). The Row scramble initial value stor-age 45 keep storing the value $S_1$ during the period when the data in the same row is input (during the period of M=1). After that, the process according to the value of the column count value N is repeated as described above during the period of M=1. The same process is repeated until the row count value M reaches 215, thereby creating a scramble value $S_Q$ of byte data $D_Q$ that is input in the recording byte sequence P.

This embodiment combines the 108-time SFR 41, the 216-time SFR 42, and the scramble update SFR 43 and controls the selection of their outputs for the input data of the recording byte sequence P that is input in the row direction shown in FIGS. 2 and 3, thereby performing shift operation that is equivalent to the operation by the shift register 30 on the encoding byte sequence Q. This allows sequential processing of the recording unit block that is input in the recording byte sequence P without the process of loading the entire recording unit block into a buffer and rearranging the data into the encoding byte sequence Q.

Since the data in the recording unit block shown in FIG. 3 circulates in 216 or 108 times, it is feasible to combine the 108-time shift registers SFR 41, for example. In this case, the processing that requires 216 times of shift operations may perform the operation in the 108-time shift registers SFR two times. Further, since the number of shifting times that is required for the shift operation is 108, use of a combination of SFR that can perform shift operation the number of times that is an exponential of 2 in divisors of 108 allows calculating a scramble value of data that is input in the recording byte order P.

5. Error Detector

An error detector of a reproducing unit according to this embodiment is described below. In Blu-ray discs, 4-byte (32-bit) error detecting code (EDC) is added to 2048-byte (16384-bit) data I(x) in each code string D0 to D31 shown in FIG. 2. The 32-bit error detecting code can be obtained by dividing 16384-bit code string I(x) by the following generating polynomial:

$$G(x)=X^{32}+X^{31}+X^4+1 \qquad \text{Expression 4}$$

An error detecting code EDC(x) to be added to the 16384-bit code string I(x) is represented by the following expression:

$$EDC(x)=\Sigma b_t{}^*X^t=I(x) \bmod G(x)(\Sigma{:}t=31 \text{ to } 0)$$

$$\text{where } I(x)=\Sigma b_t{}^*X^t(\Sigma{:}t=16415 \text{ to } 32) \qquad \text{Expression 5}$$

As a result, a code string D(x) added with an error detecting code EDC(x) is represented by the following expression:

$$D(x)=I(x)+EDC(x) \qquad \text{Expression 6}$$

When recording data on a Blu-ray disc, a recording unit block composed of 32 code strings D(x) or logical sectors where EDC(x) calculated by the expression 5 is added and auxiliary data are interleaved and recorded on the disc as one ECC block so as to prevent burst errors or the like. When reading and reproducing the ECC block, the above data is deinterleaved into the recording unit block composed of 32 code strings D(x). Each recording unit block is then error-corrected as needed and an error detecting value for each code string D(x) is calculated.

Figure 11:
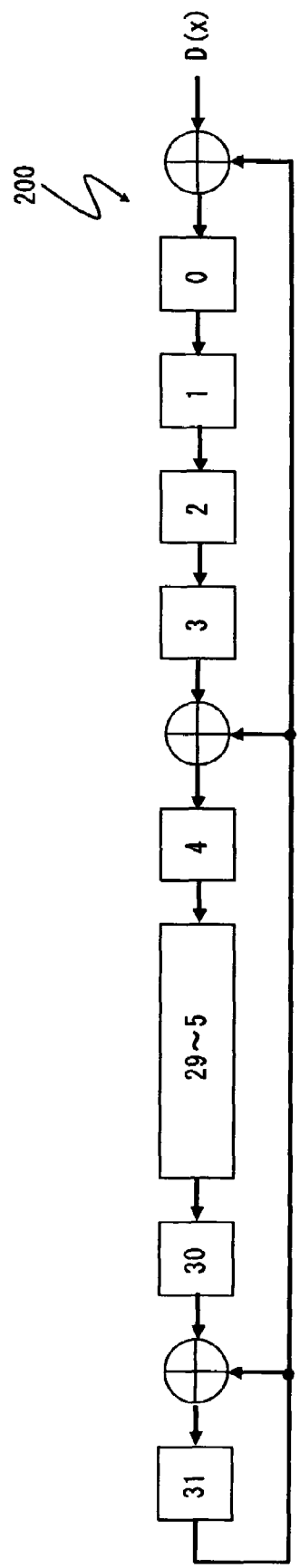
FIG. 11 is a view showing error detecting codes and an operation unit for error detection.

The error detecting code EDC(x) represented by the expression 5 can be obtained by inputting the code string D(x) into the 32-bit shift register shown in FIG. 11. A value of the 32-bit shift register after inputting all the codes of the code string D(x) serves as an error detecting code EDC(x) (=0). Normally, an error detector for detecting an error of data read from a disc calculates 32-bit shift register value that is obtained by inputting all the codes of the read code string D(x) to an operation unit that is similar to the one for adding an error detecting code and detects an error when the 32-bit shift register value is not 0. Thus, inputting D(x) to the 32-bit shift register shown in FIG. 11 allows determining whether a remainder after dividing D(x) by G(x) is 0 or not (D(x) mod G(x)=0 or not 0), thereby detecting an error.

On the other hand, in a Blu-ray disc, the code string D(x) where the error detecting code EDC(x) is added is recorded in a different order from the encoding sequence in order to prevent burst errors. Therefore, the sequence of read data (recording sequence) is different from an original sequence (encoding sequence). It is thus impossible to input read data that is read from an optical disc in the same recording sequence when calculating an error detecting value by the shift register 200 shown in FIG. 11. This raises the need to rearrange the data into the encoding sequence beforehand.

Figure 12:
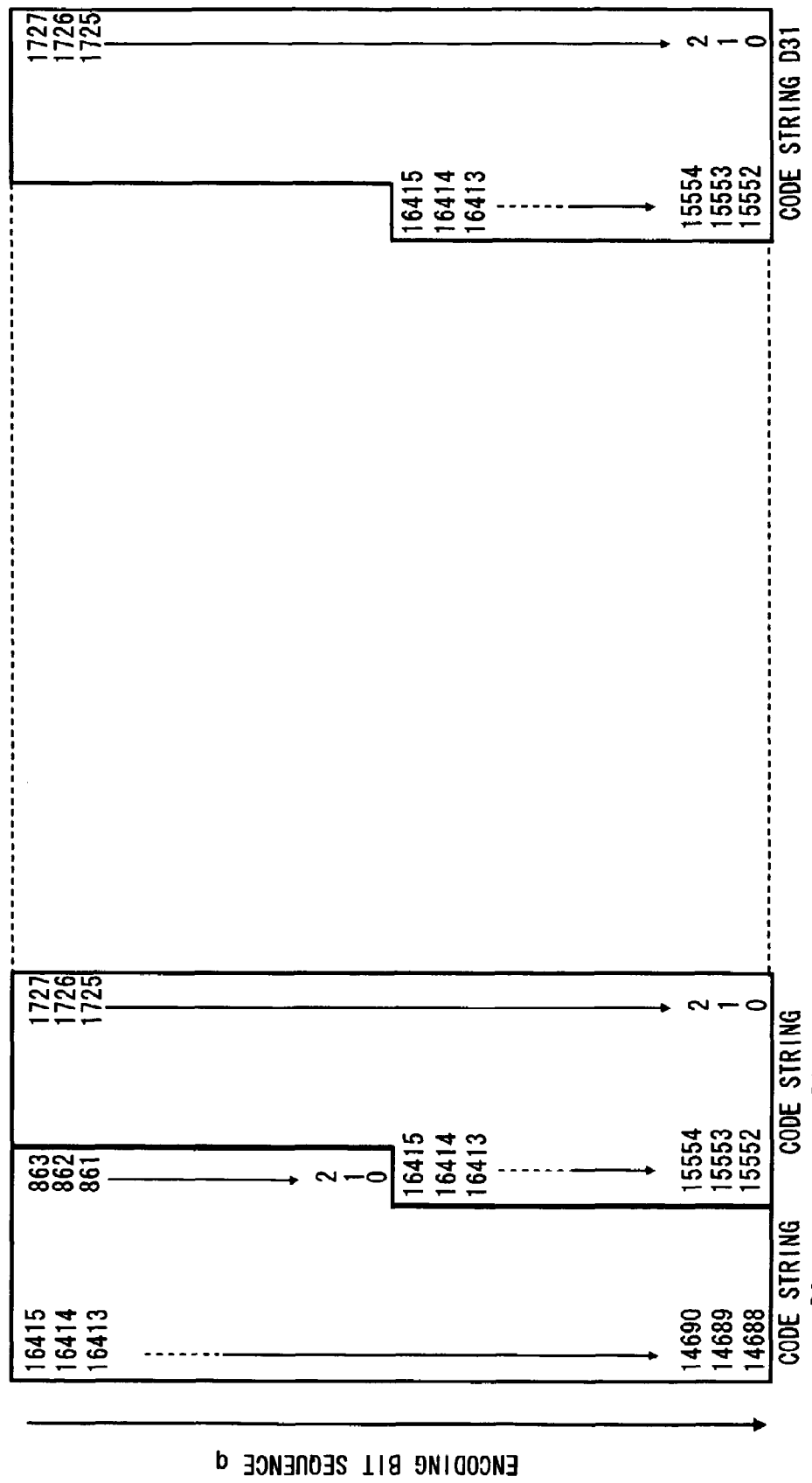
FIG. 12 is a view to describe the arrangement sequence of data in units of bits contained in a recording unit block of a Blu-ray disc.

To overcome this drawback, this embodiment proposes an error detecting method that allows calculating an error detecting value in a different processing sequence from the encoding sequence without using the shift register shown in FIG. 11. An error detector has a circuit that allows data input in units of bytes to be processed in units of bits. FIGS. 12 and 13 are views that represent the data format in units of bytes shown in FIGS. 2 and 3, respectively, in units of bits.

This embodiment describes a byte sequence in the row direction as a recording sequence and a byte sequence in the column direction as an encoding sequence. FIG. 12 is a view that shows an arrangement order of the data in a recording unit block in units of bits. FIG. 13 is an enlarged view of two code strings. The numerical values in FIGS. 12 and 13 indicate the encoding bit sequence of each bit. If the bits in the column direction are associated with an encoding bit sequence q as shown in FIGS. 12 and 13, a sequence where the bits from MSB to LSB in the encoding bit sequence q are rearranged in the row direction is a sequence of actually recording data on a disc (recording bit sequence p).

One code string D(x) is composed of 16416-bit (2052-byte) data. In each code string D(x), the byte data in the column direction perpendicular to the recording direction is associated with an encoding byte sequence Q. The bits in the byte data in the encoding sequence are associated with an encoding bit sequence q of 16415→16414→ . . . → 14689→14688→14687→ . . . →1→0. The 32 code strings D(x) constitute a recording unit block F(x) of 65664 bytes. The data read from a disc is in the recording bit sequence p, and the descrambling processing described above and an error detecting processing in this error detector are performed in the recording byte sequence P with 1 byte containing 8 bits in the recording bit sequence p. The recording bit sequence p is a sequence in the row direction having 8 bits in each column when rearranging data in the column direction so that the encoding bit sequence q is continuous. Thus, the recording bit sequence p=0→1→ . . . →7→8→9→ . . . →15→ . . . corresponds to the encoding bit sequence q=16415→16414→ . . . →16408→14687→14686→ . . . → 14680→ . . . (cf. FIG. 4).

An error detector of this embodiment receives the recording unit block 100 in the recording byte sequence P in units of bytes composed of 8-bit data in each column as shown in FIG. 13. Thus, the bit data read from a disc in the recording bit sequence p is input in the recording byte sequence P each row of which contains 304 bytes (2432 bits) composed of 304 columns each having 8 bits, which are arranged in the row direction. In this embodiment, the data input in the recording byte sequence P is represented by $D_{P,i}$ sequentially from the 0th byte, where "i" satisfies $0 \leq i \leq 7$ and indicates a processing order of 8 bits contained in 1 byte in the recording bit sequence p.

Further, in a recording block F(x), a column number is represented by N, a bit row number is represented by m, and a row number is represented by M. For example, byte data of N=0 and M=0 (encoding bit sequence q=16415 to 16408) is in the recording byte sequence P=0, input to the error detector in the 0th order, and represented as $D_{P=0,i}$. Similarly, byte data of N=18 and M=0 is in the recording byte sequence P=18, and bit data of m=1 in the encoding bit sequence q=1726 is input as a 2nd bit of the byte data in the recording byte sequence P=18, and represented as $D_{P=18,1}$. In this way, data of N=0 and M=215 is in the recording byte sequence P=65360 and bit data in the encoding bit sequence q=14688 is input as an 8th bit of the byte data in the recording byte sequence P=65360 and represented as $D_{P=65360,7}$.

To facilitate the understanding of an error detector of this embodiment, the principal is described first. In a Blu-ray disc, an error detecting value is a shift register value that is obtained by inputting a code string D(x) (encoding bit sequence q=16415 to 0) to the shift register 200 shown in FIG. 11. For example, a code string D(x)=D0 is input to the shift register 200, and D0 is "1" only for the following 3 bits and "0" for all the other values. The 3 bits are: 16415th order data in the recording bit sequence p=0, that is the data input in the 0th order (q=16415), 14687th order data in the recording bit sequence p=1728, that is the data input in the 1728th order (q=14687), and 12959th order data in the recording bit sequence p=3456, that is the data input in the 3456th order (q=12959). $B_{16415}=B_{14687}=B_{12959}=1$ is satisfied.

In this case, the result of inputting the code string D0 to the 32-bit shift register 200 is calculated by initializing the shift register 200 to "00000001h", obtaining values after shifting this value 16415 times, 14687 times, and 12959 times, respectively, and performing XOR operation on these values. The result E0 of inputting the code string D0 to the 32-bit shift register 200 is calculated by the following expression:

$$E0 = B_{16415} X^{16415} \bmod G(x) + B_{14687} X^{14687} \bmod G(x) + B_{12959} X^{12959} \bmod G(x) = (X^{16415} + X^{14687} + X^{12959}) \bmod G(x)$$

Expression 7

Given this conception, the result E0 that is obtained by inputting all of the code strings D0 to the shift register 200, which is 32-bit shift register value, can be calculated by performing XOR operation on shift register values where the bit data that forms the code string is "1". Specifically, in the case of code string D0, since only the three bits of the data of 16415th order that is input in the 0th order, the data of 14687th order that is input in the 1728th order, the data of 12959th order that is input in the 3456th order indicate "1" and the other data indicates "0", performing XOR operation with the coefficients of $B_{16415}$, $B_{14687}$, and $B_{12959}$ allows calculating the shift register value E0.

Therefore, calculation of $X^{16415} \bmod G(x)$, $X^{14687} \bmod G(x)$, and $X^{12959} \bmod G(x)$ allows obtaining an error detecting value E(x) that is a 32-bit shift register value in the code string D(x).

Each code string D(x) of the recording unit block is composed of 16416 bit data. If the above $X^q \bmod G(x)$, for example, is held for each bit so as to refer to $X^q \bmod G(x)$ corresponding to the encoding bit sequence q upon input of input bit data "1", it is possible to calculate 32-bit shift register value of the code string D(x) by performing XOR operation. The easiest way to calculate a 32-bit shift register value is to store 16416 $X^q \bmod G(x)$ that correspond to each bit of the code string D(x) and perform XOR operation on all the $X^q$ mod G(x) in the encoding bit sequence of the input data. $X^q$ mod G(x) is referred to hereinafter as the substitute value.

One code string D(x) is composed of (q+1)=k(1≦k) bit. Each bit has a substitute value $X^q$ mod G(x) that corresponds to its encoding bit sequence q. The substitute value $X^q$ mod G(x) indicates a remainder after dividing a code string (hereinafter as the substitute code string d(x)) where all the bits of a k-bit code string D'(x) is 0 except for a q-th order bit by G(x), which is an error detecting value of the substitute code string d(x). The substitute code string is a syndrome when a corresponding bit of an original code string is in error for an error correcting code calculated from an original code string, that is, when only one bit data of an original code string D(x) is in error.

A k-bit code string D(x) corresponds to a k-number of substitute code string d(x). A remainder after dividing the substitute code string d(x) by G(x) is a substitute value $X^q$ mod G(x). An error detecting value E(x) can be calculated by performing XOR operation on all the substitute values $X^q$ mod G(x) corresponding to the bit with code "1" in the input code string D(x). Though this embodiment calculates the substitute values $X^q$ mod G(x) in advance and stores the values in a table, it is feasible to calculate the values when needed.

Figure 14:
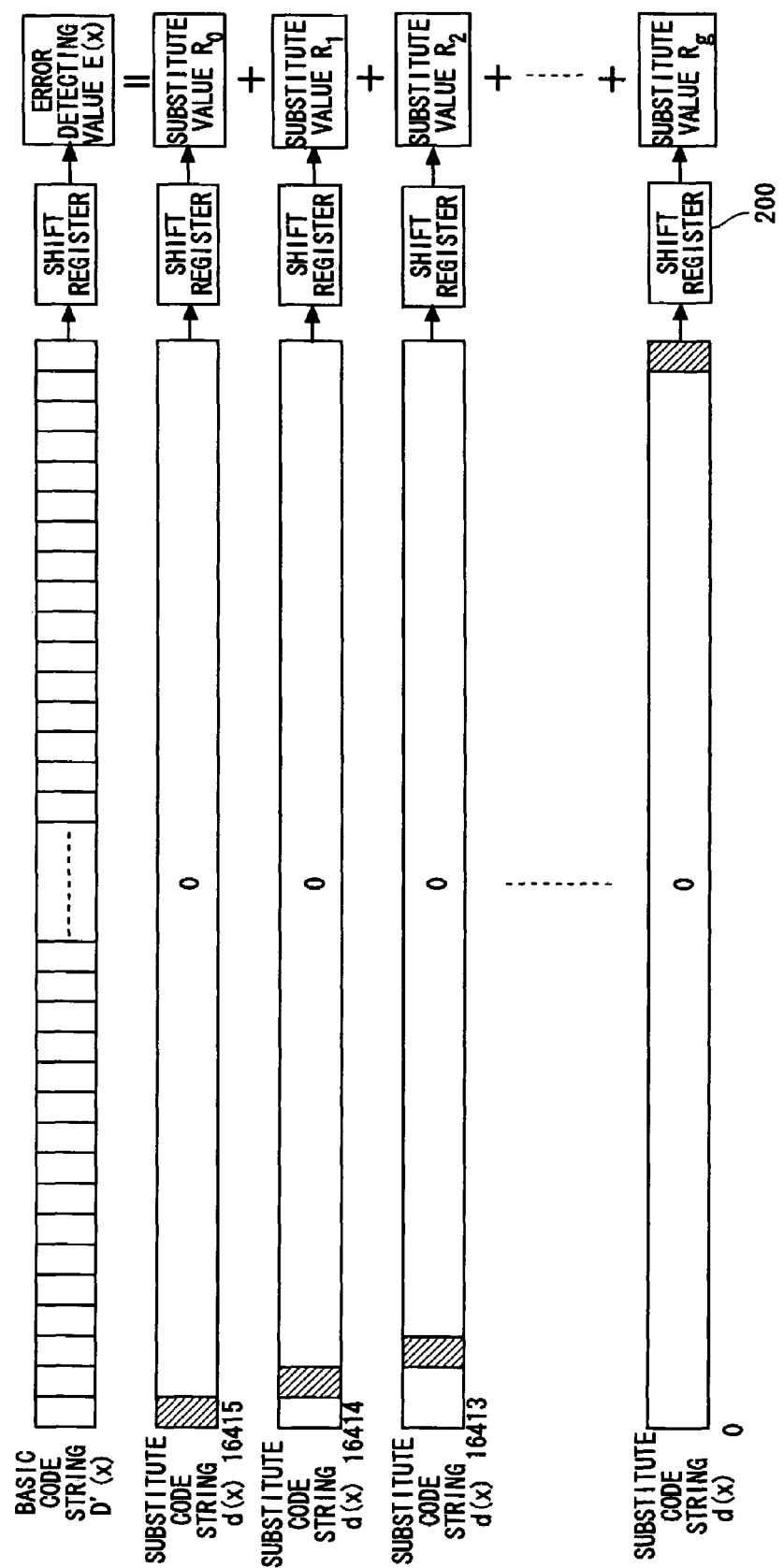
FIG. 14 is a view to describe an error detecting value calculation method according to an embodiment of the present invention.

FIG. 14 is a view to describe a method of calculating en error detecting value by using the conceptions. It is assumed that a code string {111 . . . 1} where the bits of the k-bit code string D(x) are all "1" is a basic code string D'(x). A 32-bit shift register value that is obtained by inputting the code string D'(x) to the shift register 200 shown in FIG. 11 indicates an error detecting value E'(x) of the code string D'(x). The following description describes a code string D'(x) of k=q+1=16416 bits.

As described above, the basic code string D'(x) corresponds to a k-number of substitute code strings d(x). If the k-bit code string is associated with an encoding bit sequence q=16415 to 0, one code string corresponds to a k-number of substitute code strings d(x) where bit data in a certain order of an encoding bit sequence is "1" and all the other bit data is "0". In each substitute code string d(x), one bit in a different position of each encoding bit sequence indicates "1". Specifically, the substitute code strings d(x) includes a substitute code string $d(x)_{16415}$={100 . . . 0} where only a most significant bit (q=16415) is "1", a substitute code string $d(x)_{16414}$={010 . . . 0} where only a bit with the 16414th order is "1", a substitute code string $d(x)_{16413}$={001 . . . 0} where only a bit with the 16413th order is "1", and a substitute code string $d(x)_0$={000 . . . 1} where only a bit with the 0th order is "1". The 32-bit shift register value that is obtained by inputting the substitute code strings $d(X)_q$ to the shift register 200 is a substitute value $X^q$ mod G(x)=$R_q$. The substitute value $X^q$ mod G(x)=$R_q$ corresponds to the encoding bit sequence q.

Thus, when composed of bit data having the same number of bits as the code strings and associated with the same bit sequence as the code strings, a substitute code string corresponding to a bit sequence is the one where only the bit data in the bit sequence indicates "1" and all the other bit data indicates "0". A substitute value of each bit data in the code string is a result (operation value) of inputting the substitute code string in the encoding bit sequence of the bit data to the shift register 200. Therefore, the 32-bit shift register value (error detecting value E'(x)) that is obtained by inputting the code string D'(x) to the shift register 200 is a result of performing XOR operation on all the 32-bit shift register value (substitute value $R_q$) that is obtained by inputting each substitute code strings d(x)q to the shift register 200.

As described above, an error detecting value E(x) of a code string D(x) can be obtained by storing the same number of substitute values $X^q$ mod G(x)=$R_q$ as the number of bits of the code string D(x), which is substitute values $R_q$ of k=16416 in this embodiment, in a table and performing XOR operation of the substitute values $R_q$ having the bit with code "1" of the input code string D(x). Since this method eliminates the need for inputting the code string D(x) to the shift register 200, it is possible to calculate an error detecting value E(x) even when the inputting sequence of the code string D(x) is different from the encoding bit sequence.

The data is processed in units of recording unit blocks. Since a recording unit block F(x) contains 32 code strings D(x) and an error detecting value E(x) is calculated for each code string D(x), 32 error detecting values E(x) are obtained from one recording unit block F(x).

Now, a method of calculating an error detecting values E(x) with a smaller number of substitute values corresponding to each bit data than a total bit number k is described below. This embodiment forms an error detector with 19 substitute values, which is smaller than k=16416 described above, by using the regularity of the arrangement sequence of bit data and arrangement of byte data in a recording unit block.

The recording unit block F(x) is supplied from the rotator 12 (see FIG. 1) in the recording byte order P shown in FIG. 13 in units of bytes after it is set to the state before rotation. The bit data of 8 bits contained in the byte data $D_{P,i}$ in units of bytes are bits in the column direction where the encoding bit sequence q lies continuously. Therefore, the substitute value $R_q$ for each bit in the row with a bit row number m=j is a shift register value that is obtained by inputting a substitute value $R_{q-1}$ for each bit in the immediately previous row with a bit row number m=j−1 to the shift register 200 shown in FIG. 11 and shifting this value once. Thus, it is possible to calculate the substitute value $R_q$ for each bit data easily from the substitute value corresponding to one bit data without storing the substitute values $R_q$ corresponding to all 8 bits of bit data contained in the input byte data.

This allows easily converting each bit data to a substitute value corresponding to the bit data by simply preparing a substitute value corresponding to one bit data for each byte data as a specific substitute value to the byte data, which is referred to hereinafter as the specific substitute value. In this case, the number of substitute values to be held is k/8=K, thus reducing the substitute values to ⅛, which is 2052.

Further, as described with reference to FIGS. 2 to 6, 12 and 13, an optical disc of this embodiment has recording unit blocks each of which is composed of 32 code strings where 304 columns, each column containing 216 byte data in the encoding byte sequence Q or 1728 bit data in the encoding bit sequence q, are arranged in the column direction. Therefore, as shown in FIG. 3, the encoding byte sequence Q in each column direction is continuous. Further, as shown in FIG. 13, the byte data in each column direction is continuous with the encoding bit sequence q increasing one by one from the 0th to 215th row.

One code string D(x) is composed of 9 columns and half, and a recording unit block F(x) includes a set of even number and odd number code strings. Thus, 19 sets of code strings are arranged one after another. As shown in FIGS. 2 and 3, each recording byte sequence P contains 19 different encoding byte sequences Q, and a next code string set of even number and odd number code strings also has the same encoding byte sequences Q in each of 19 recording byte order P. As described above, in the optical disc of this embodiment, one recording unit block has 19 encoding byte sequences Q that are arranged repeatedly with the regularity.

Thus, this embodiment holds 19 specific substitute values in a particular row of one encoding sequence set as particular specific substitute values $U_0$ to $U_{18}$, calculates a specific substitute value $R_Q$ in another row from the specific substitute values $U_0$ to $U_{18}$, and then calculates a substitute value $R_q$ from each specific substitute value $R_Q$, so that the number of substitute values to be held is the same as the number of particular specific substitute values $U_0$ to $U_{18}$, which is only 19.

Hence, the number k of substitute values $R_q$ corresponding to the number of bits contained in one code string $D(x)$ is 16416, this embodiment can significantly reduce the number of data amount to be held as substitute values to 19, which is $\frac{1}{864}$, by using the regularity of data arrangement contained in the recording unit block.

Figure 15:
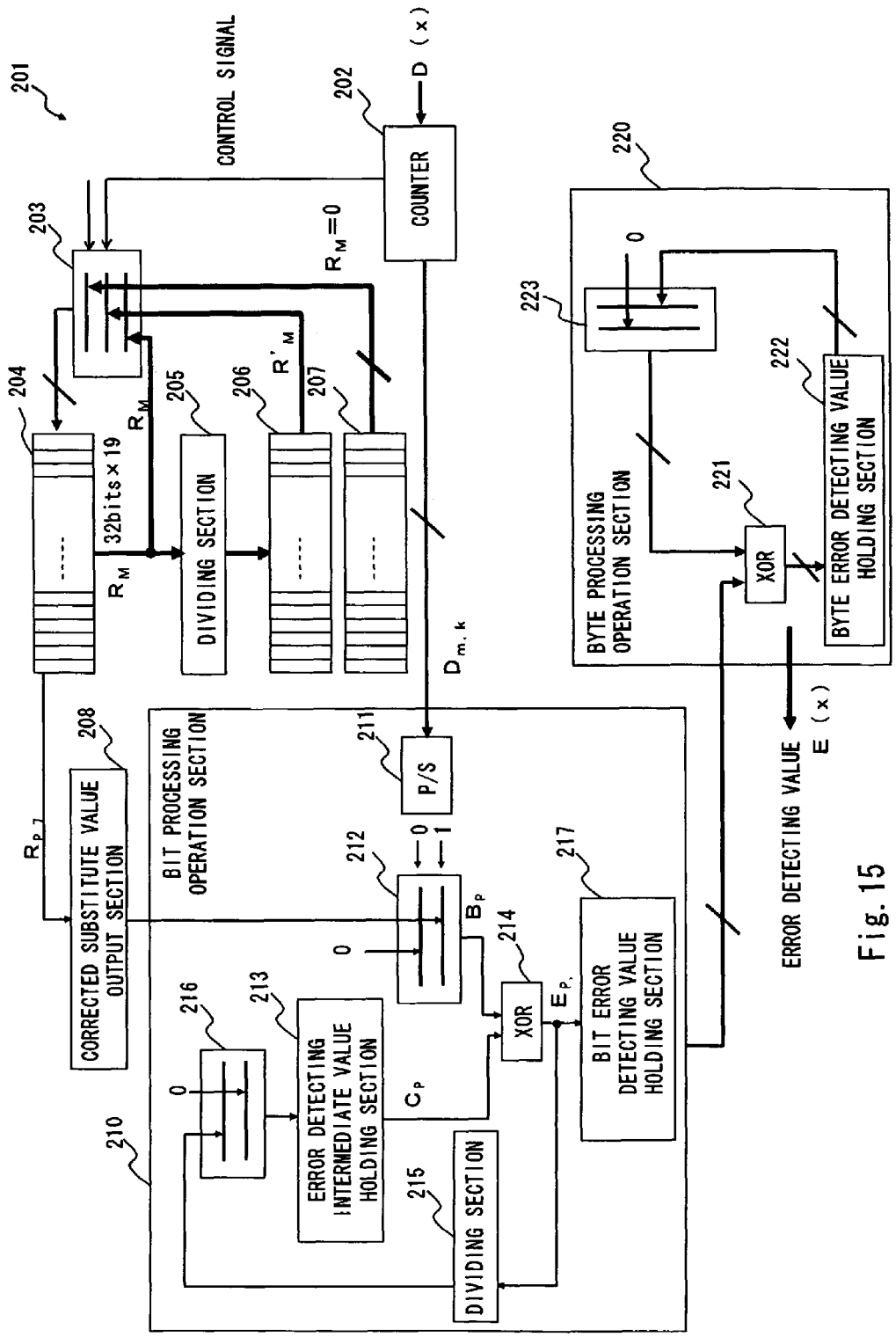
FIG. 15 is a block diagram showing a specific configuration of an error detector in a reproducing unit according to an embodiment of the present invention.

An error detector of a reproducing unit according to the present invention is described hereinafter in detail. FIG. 15 is a block diagram that shows a specific configuration of the error detector. A read recording unit block $F(x)$ is input as byte data in units of bytes in the recording byte order P to the descrambler where it is descrambled. The descrambled byte data is then input to the error detector 201 in the recording byte sequence P. The error detector 201 detects an error by calculating an error detecting value of a code string added with an EDC. A detection target code string to be error-detected contains 2052-byte, each byte data being associated with. The error detecting value is obtained when the detection target code string is processed in the encoding byte sequence Q by a predetermined operation method.

The error detector 201 includes the counter 202 that counts the columns and rows of byte data and a substitute value output section that outputs a specific substitute value corresponding to input byte data. The substitute value output section includes a data switch 203, a substitute value table 204, a dividing section 205, an update specific substitute value table 206, a particular specific substitute value table 207, and a corrected substitute value output section 208.

The output of the data switch 203 is controlled according to a count value of the counter 202. The substitute value table 204 holds 19 specific substitute values corresponding to the rows of present input data. The dividing section 205 divides the present substitute values and calculates 19 updated substitute values corresponding to the next rows. The update specific substitute value table 206 holds the results of division. The particular specific substitute value table 207 holds 19 particular specific substitute values. The corrected substitute value output section 208 receives updated substitute value (hereinafter as the corrected substitute value) of each column from the substitute value table 204. Each section processes the data in units of bytes composed of 8 bits.

The substitute value, specific substitute value, particular substitute value, and corrected substitute value are each prepared so that they are substitute values corresponding to the encoding bit sequence associated with the bit data of each input byte data. The error detector 201 calculates an error detecting value from each bit data and a substitute value associated with each bit data and corresponding to the encoding bit sequence q that is different from the input sequence (recording byte sequence P/recording bit sequence p). In the following, a substitute value (specific substitute value) that corresponds to byte data $D_{P,i}$ in the recording byte sequence P is represented by $R_{P,i}$. Specifically, each bit data of the byte data $D_{P,i}$ is associated with the encoding bit sequence q and a substitute value $R_q$ corresponding to the encoding bit sequence q is the specific substitute value $R_{P,i}$.

Further, the error detector 201 includes an error detecting value calculation section calculating the error detecting value of the detection target code string according to an output result of the substitute value output section. The error detecting value calculation section calculates the error detecting value by processing each byte data of the detection target code string and the specific substitute value corresponding to the encoding byte sequence Q in the recording sequence P different from the encoding sequence.

The error detecting value calculation section includes a bit processing operation section 210 and a byte processing operation section 220. The bit processing operation section 210 calculates a byte error detecting value per byte in units of bits from the output of the corrected substitute value output section 208 and input byte data. The byte processing operation section 220 receives the result from the bit processing operation section 210 and outputs an error detecting value $E(x)$ for one code string $D(x)$. The byte processing operation section 220 includes a logic circuit (XOR) 221, a byte error detecting value holding section 222, and a reset section 223, and receives a byte error detecting value $E_P$ of each byte output from the bit processing operation section 210. The logic circuit (XOR) 221 calculates XOR of the error detecting value $E_P$ of the present input byte data and the XOR operation result of the error detecting value of the preceding input byte data. The byte error detecting value holding section 222 holds the output from the XOR 221 and outputs the value that is held in the 2051th time as an error detecting value $E(x)$ of the code string $D(x)$. The reset section 223 resets the data of the error detecting value holding section 222 each time a new recording unit block $F(x)$ is input. Though only one byte processing operation section 220 is illustrated, there are provided the same number of the byte error detecting value holding sections 222 as the number of code string $D(x)$ contained in the recording unit block $F(x)$, and a byte error detecting value corresponding to byte data of each code string $D(x)$ is supplied from the bit processing operation section 210 to each byte error detecting value holding section 222. The part other than the byte error detecting value holding sections 222 may be used in common.

The counter 202 receives descrambled recording unit block $F(x)$ in units of bytes and counts it to update a count value N of a column number N and a count value M of a row number M. The counter 202 also supplies byte data $D_{P,i}$ to the bit processing operation section 210. As described above, in the input byte data $D_{P,i}$, "P" represents a recording byte sequence where the recording byte sequence P=0 to 16415 in a code string $D(x)$ of one recording unit block $F(x)$, and "i" represents 0 to 7th bit number contained in one byte data, which is composed of 8-bit data with a successive encoding bit sequence.

The code string $D(x)$, which is in units of bytes, receives byte data in the recording byte sequence P shown in FIG. 3 in the order of: $D_{P=0,i} \rightarrow D_{P=1,i} \rightarrow D_{P=2,i} \rightarrow \ldots \rightarrow D_{P=65662,i} \rightarrow D_{P=65663,i}$. The counter 202 increments the column count number N each time the data $D_{P,i}$ is input. The counter 202 resets the count value N to 0 after it counts the column count value N to 303. It increments the byte row count value M at the timing of resetting the column count value N to 0. Further, the counter 202 outputs a control signal to control switching of the data switch 203 according to the column count value N and the byte row count value M. It is feasible to generate and output each control signal to control the output of the specific substitute value table 204, the bit processing operation section 210, and the byte processing operation section 220 according to the count values N and M.

For example, it is feasible to supply a control signal to the specific substitute value table 204 at the timing of updating the column count value N, which is a data input timing of inputting byte data so as to select and output one of 19 particular specific substitute values $R_{M=0}$ (=$U_0$ to $U_{18}$) that are stored in the specific substitute value table 204. It is also feasible to output a control signal to the bit processing operation section 210 at the data input timing so as to reset an error detecting intermediate value, which is described later, to 0. Further, it is feasible to output a control signal to the byte processing operation section 220 at a timing when input of all code strings D(x) of one recording unit block F(x) ends so as to reset the output of the reset section 223 to 0.

The data switch 203 receives a specific substitute value ($U_0$ to $U_{18}$) corresponding to a column count value M including the present input byte data from the substitute value table 204, an update substitute value $R'_M$ corresponding to the next row stored in the update specific substitute value table 206, and a particular specific substitute value $R_{M=0}$ stored in the particular specific substitute value table 207. The dividing section 205 receives the substitute value from the substitute value table 204 and performs a predetermined operation, which is described later, to calculate an update substitute value $R'_M$ that is a substitute value in the row next to the present row. The update substitute value $R'_M$ is stored in the update specific substitute value table. 206.

The data switch 203 selects a particular specific substitute value $R_{M=0}$ at a timing when the byte row count value M turns from 215 to 0 and outputs the value to the substitute value table 204. At a timing different from the timing when the byte row count value M turns from 215 to 0, the data switch 203 selects the update substitute value $R'_M$ corresponding to the next row from the update specific substitute value table 206 and outputs the selected value to the substitute value table 204 each time the byte row count value M is incremented and an update signal is input. The substitute value table 204 selects the presently stored 19 particular specific substitute values $R_M$ successively from a substitute value corresponding to the 0th row at the timing when the column count value N is incremented or when data is input and outputs the selected value to the corrected substitute value output section 208 as a corrected substitute value $R_P$.

The update specific substitute value table 206 holds the update substitute value $R'_M$ that is a specific substitute value corresponding to input byte data in the next row generated from the present substitute value by the dividing section 205 and outputs this value each time the byte row count value M is updated. The particular specific substitute value table 207 of this embodiment stores substitute values $U_0$ to $U_{18}$ corresponding to the 7th bit data of the recording byte sequence P=0 to 19 (data $D_{P=0,7}$ to $D_{P=19,7}$) as a particular specific substitute value $R_{M=0}$ in the code string D(x) of 16416 bits.

Though this embodiment describes the case where the particular specific substitute value is the substitute value $R_{M=0} = R_{0,7}$ to $R_{=18,7}$ that corresponds to the 7th bit of each byte data that is input in the 0th to 18th order, the particular specific substitute value is not limited thereto. It may be a specific substitute value $R_P$ that corresponds to any one row of any code string set. The specific substitute value $R_P$ may be a substitute value that corresponds to any of 8 pieces of bit data in byte data.

This embodiment produces an update substitute value $R'_M$ by performing update operation so that the 19 particular specific substitute values $R_{M=0}$ are specific substitute values $R_M$ of each row, thereby reducing the number of prestored substitute values to only 19 pieces of particular specific substitute values $R_{M=0}$.

Figure 16:
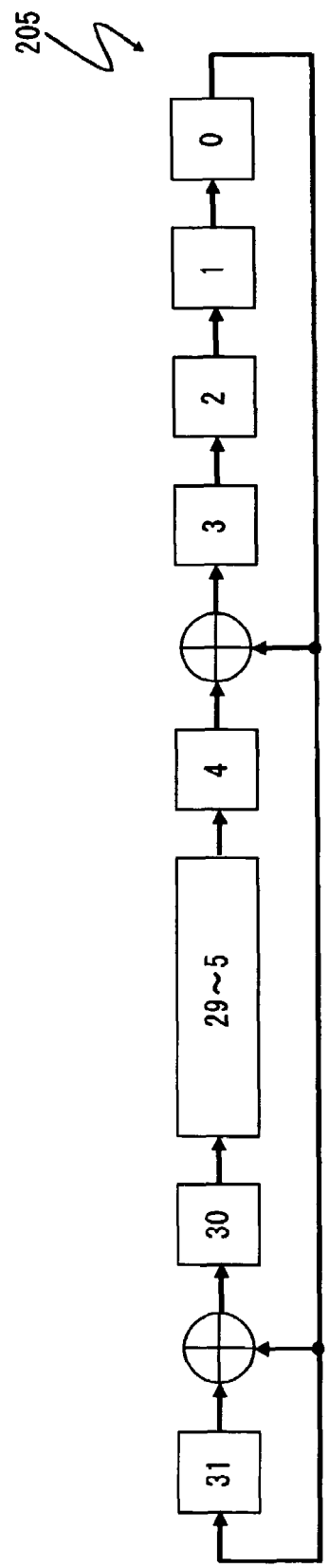
FIG. 16 is a view to describe a dividing section 205 in the error detector of FIG. 15.

The dividing section 205 is a shift register that performs shift operation that is reverse to the shift register 200. FIG. 16 shows the dividing section 205. Receiving the 19 specific substitute values $R_{P,7}$, the dividing section 205 shifts the values 8 times and outputs a substitute value of the immediately next row. For example, the particular specific substitute values $R_{M=0}$ in the 0th row turns to a particular specific substitute value $R_{P=304,i=7}$ to $R_{P=322,i=7}$ in the 1st row by 8 times of shift operations.

The bit processing operation section 210 includes a parallel/serial converter (hereinafter as P/S converter) 211, a switch 212, an error detecting intermediate value holding section 213, a logic circuit (XOR) 214, a dividing section 215, a switch 216, and a bit error detecting value holding section 217. The P/S converter 211 receives 8-bit data that is supplied in parallel as input data $D_{P,i}$ and outputs this data as serial bit data. The switch 212 selects the output of the corrected substitute value output section 208 according to the output of the P/S converter 211. The XOR 214 performs XOR operation of the outputs of the switch 212 and the error detecting intermediate value holding section 213. The dividing section 215 divides the output of the XOR 214. The switch 216 selects one of the output of the dividing section 215 and 0 and outputs the selected value. The bit error detecting value holding section 217 outputs a byte error detecting value each time a bit error detecting value output from the XOR 214 is updated 8 times.

The bit processing operation section 210 is described herein in further detail. The P/S converter 211 converts 8-bit byte data $D_{P,i}$ to serial data and successively outputs it one bit by one bit. The switch 212 outputs "0" if the input bit data $D_{P,i}$ that is converted serially is "0" and selects the output (corrected substitute value) of the corrected substitute value output section 208 if it is "1". The dividing section 215 is the shift register 200 shown in FIG. 11 and divides the output result of the XOR 214. The switch 216 keeps selecting the output of the dividing section 215 until the operation of 1 byte ends and then selects and outputs 0 each time the operation of 1 byte ends, that is, after the operation is performed 8 times. The error detecting intermediate value holding section 213 stores the division result of the dividing section 215 as an error detecting intermediate value $C_{P,i}$. The XOR 214 calculates XOR of the error detecting intermediate value $C_{P,i}$ stored in the error detecting intermediate value holding section 213 and a corrected substitute value for the data $D_{P,i}$ or 0 and outputs the result as a bit error detecting value $E_{P,i}$ to the bit error detecting value holding section 217.

For example, if input byte data $D_{P,i}$ is supplied to the P/S converter 211, the P/S converter 211 outputs serial data $D_{P,0}$, data $D_{P,1}$ to data $D_{P,7}$, successively. The encoding bit sequence q of one input byte data is q+7 to q, for example. In this case, byte data composed of bit data corresponding to $b_{q+7}$ to $b_{q+0}$ is input as $D_{P,i}$. Then, the P/S converter 211 outputs bit data per 1 bit in the order of MSB, $b_{q+7} \rightarrow b_{q+6} \rightarrow b_{q+5} \rightarrow b_{q+4} \rightarrow b_{q+3} \rightarrow b_{q+2} \rightarrow b_{q+1} \rightarrow b_{q+0}$. The corrected substitute value output section 208 stores $X^q \bmod G(x)$ as the corrected substitute value $D_{P,i=7} = R_q$.

When the first bit bq+7 is output from the P/S converter 211, the bit error detecting value holding section 217 stores:

$$E_{P,0} = b_{q+7} X^{q+1} \bmod G(x) + C_{P,0}.$$

The error detecting intermediate value $C_{P,0} = 0$.

This value is divided by the dividing section 215 to generate the following error detecting intermediate value:

$$C_{P,1} = (b_{q+7} X^{q+1} \bmod G(x)) \bmod G(x) = b_{q+7} X^{q+1} \bmod G(x).$$

This value is stored in the error detecting intermediate value holding section 213.

Then, when the second bit $b_{q+6}$ is output from the P/S converter 211, the bit error detecting value holding section 217 stores:

$$E_{P,1}=b_{q+6}X^q \bmod G(x)+b_{q+7}X^{q+1} \bmod G(x)=(b_{q+6}X^q+b_{q+7}X^{q+1})\bmod G(x).$$

Similarly, this value is divided by the dividing section 215 to generate the following error detecting intermediate value:

$$C_{P,2}=((b_{q+6}X^{q+1}+b_{q+7}X^{q+2})\bmod G(x))\bmod G(x)=(b_{q+6}X^{q+1}+b_{q+7}X^{q+2})\bmod G(x).$$

This value is stored in the error detecting intermediate value holding section 213.

In this way, the bit error detecting value after the 8th bit bq+0 is finally input is:

$$E_{P+7}=(b_{q+7}X^{q+7}+b_{q+6}X^{q+6}+b_{q+5}X^{q+5}+b_{q+4}X^{q+4}+b_{q+3}X^{q+3}+b_{q+2}X^{q+2}+b_{q+1}X^{q+1}+b_{q+0}X^{q+0})\bmod G(x).$$

This value is a byte error detecting value $E_P$ that is an error detecting value for 1-byte data.

The byte error detecting value $E_P$ is supplied to the byte processing operation section 220 one byte by one byte. The byte error detecting value $E_P$ is input to the XOR 221 of the byte processing operation section 220 and output as an error detecting value E(x) after XOR of 2052 bytes is calculated. The byte error detecting value holding section 222 is composed of 32 holding sections, for example, and stores the results of the XOR 221 every 10 or 9 bytes according to the column count value N, thereby holding the value corresponding to each code string D(x). Then, during input of the byte error detecting value $E_P$ of one recording unit block F(x), the value of each holding section is sequentially updated to the value from the XOR 221. The reset section 223 selects one from the output of the byte error detecting value holding section 222 and 0 according to the control signal from the counter 202. This embodiment outputs the value "0" in the timing after the input of one recording unit block F(x) and before the input of the first byte error detecting value $E_P$ of each code string D(x) of the next recording unit block F(x), which is the timing where the row count value M=0, N=0, 10, 19, 29, . . . , and outputs the output of the byte error detecting value holding section 222 as it is in other timings. It is feasible to reset the value to 0 after outputting the value held in each holding section of the byte error detecting value holding section 222 as an error detecting value E(x).

6. Error Detecting Method

Figure 17:
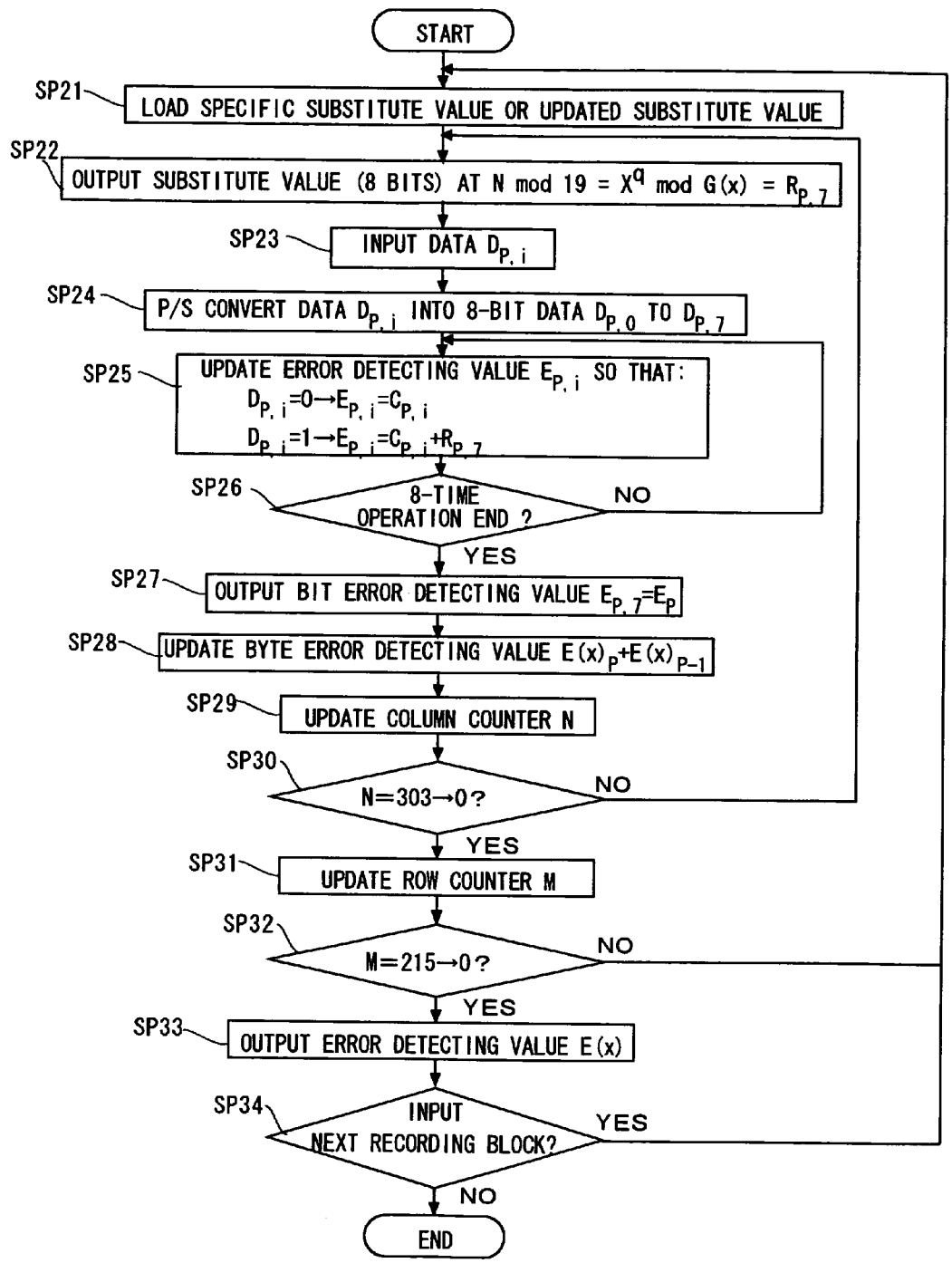
FIG. 17 is a flowchart showing an error detection process in a reproducing unit according to an embodiment of the present invention.

The operation of the error detector having the above configuration is described below. FIG. 17 is a flowchart showing the operation of the error detector 201 of this embodiment. To simplify the description, a method of calculating an error detecting value upon input of 16416 bits of code string D0($D_{q=0}$ to $D_{q=16416}$={100000000 . . . 000000001}) is described below. The symbol "q" represents the encoding bit sequence, and the code string D0 is actually input in the recording byte sequence P. That is, though the code string D0 is processed in the recording bit sequence p, each bit data is associated with the encoding bit sequence q that is different from the recording bit sequence p which is the input sequence. The code string D0 is a code string where only the most significant bit and the least significant bit are "1" and other bits are "0" when the code string D0 is rearranged into the encoding bit sequence q. The error detecting value to be calculated is a shift register value that is obtained by rearranging the code string D0 into the bit sequence q={100000000 . . . 000000001}) and inputting it into the shift register 200 shown in FIG. 11. Practically, the recording unit block F(x) composed of 32 code strings are sequentially input in the recording byte sequence P in units of bytes as described earlier.

First, particular specific substitute values U.sub.0 to U.sub.19 of the particular specific substitute value table 207 are loaded at the timing when a byte with the recording byte sequence P=0 of the recording unit block F(x) is input and stored into the specific substitute value table 204 through the data switch 203 (Step SP21) If the data is not the recording byte sequence P=0 of the recording unit block F(x) and the row count value M is updated, the update specific substitute value stored in the update substitute value table 206 is loaded. The specific substitute value table 204 sequentially outputs 19 specific substitute values until input of byte data of one row ends, that is, until input of byte data D.sub.P=0,i to D.sub.P=304,i ends if it is the 0th row, for example. In this case, the remainders 0 to 18 after dividing column numbers (column count values) N by 19 are a pointer (N mod 19) and the specific substitute value table 204 outputs a particular specific substitute value corresponding to the row indicated by the pointer to the corrected substitute value output section 208 (Step SP22). The specific substitute value of the 0th byte data, which is a substitute value R.sub.P=0,7 corresponding to bit data D.sub.P=0,7 in the 7th bit of the byte data with the recording byte order P=0 equals mod G(x) of data where only the data of 16408th order of X (X.sup.16408) is "1" (substitute code string={000000001 . . . 00000000} (16416 bytes)), which is 32-bit shift register value (18461F40h) obtained by dividing the substitute code by the shift register 30 of FIG. 7.

Then, the 0th byte data $D_{P=0,i}$={10000000(80h)} is input to the counter 202 (Step SP23). The byte data $D_{P=0,i}$ is the data with the encoding bit sequence q=16415 to 16408. The error detecting intermediate value $C_{P,i}=C_{0,0}$ is reset to 0. The P/S converter 211 converts the 0th input data $D_{P=0,i}$ into 8-bit serial data and sequentially supplies the converted data to the switch 212 one bit by one bit (Step SP24). The XOR 214 performs XOR operation on the error detecting intermediate value $C_{P,i}=C_{0,0}$ and the output $B_{P,i}$ of the switch 212 and updates the bit error detecting value $E_{P,0}$ of the bit error detecting value holding section 217 (Step SP25). Since the 0th bit data $D_{P=0,0}$=1 in this example, the switch 212 outputs a corrected substitute value ($X^q$ mod G(x)=$R_{P,7}$ where G(x)= $X^{32}+X^{31}+X^4+1$). In this example, the bit error detecting value holding section 217 stores the value $E_{P=0,0}$ that is the result of XOR operation on the corrected substitute value $R_{P=0,7}$ of 18461F40h and the error detecting intermediate value $C_{P,i}=C_{0,0}$=0.

Since not all of 8 bits are finished (No in Step SP26), the output $E_{P=0,0}$ of the XOR 214 is divided by the dividing section 215 into an error detecting intermediate value ($C_{P=0,1}=E_{P=0,0}$ mod G(x)=$R_{P=0,6}$) and stored in the error detecting intermediate value holding section 213.

In this example, after the input of the 0th bit data, mod G(x) of $R_{P=0,7}=E_{P=0,0}$=18461F40h is calculated. As a result, $C_{P=0,1}$=308C3E80h={000000010 . . . 00000000} is stored in the error detecting intermediate value holding section 213. This is the data obtained by shifting a substitute code string where only $X^{16408}$ is "1" once to the left by the shift register 30. This value equals mod G(x) of a substitute code string where only $X^{16409}$ is "1" (substitute code string={000000010 . . . 00000000} (16416 bytes)), which is 32-bit shift register value (308C3E80h) (=$R_{0,6}$) obtained by dividing a substitute code string where only $X^{16409}$ is "1" in the shift register 30 of FIG. 7.

First, since the first bit data of the 0th byte is $D_{P=0,1}=0$, the corrected substitute value $R_{P,7}$ is not selected and the error detecting intermediate value $C_{P=0,1}$ is loaded into the bit error detecting value holding section 217 through the XOR 214 (Step SP27).

That is, if the bit data $D_{P,i}$ that is input to the switch 212 is "1", the output $B_{P,i}$ of the switch 212 equals $R_q$ and if the bit data $D_{P,i}$ is "0", the output $B_{P,i}$ of the switch 212 equals 0. In the input of the 7th bit, the dividing section 215 receives the value of the error detecting intermediate value $C_{P,i}$ plus the output $B_{q,i}$ of the switch 212, and the error detecting intermediate value holding section 213 stores $(C_{Q,i}+B_{Q,i})$ mod $G(x)$.

In this example, since the remaining 1st to 7th bit data are $D_{P=0,1}$ to $D_{P0,7}=0$, the value after dividing the error detecting intermediate value by the dividing section 215 is sequentially loaded into the bit error detecting value holding section 217. That is, mod $G(x)$ of the substitute code string where only $X^{16408}$ is "1" is loaded into the bit error detecting value holding section 217 by the input of the 0th bit. The data is repeatedly divided by the dividing section 215 by the input of the 1st to 7th bit to become $X^{16408}$ mod $G(X) \rightarrow X^{16409}$ mod $G(x) \rightarrow \ldots \rightarrow X^{16415}$ mod $G(x)$. As a result, the bit error detecting value holding section 217 stores $X^{16415}$ mod $G(x)$ when the 7th bit data $D_{P=0,7}$, which is the final bit of the 0th byte, is input.

After the 8 times of operations are finished (Yes in Step SP26), the error detecting intermediate value $C_{P,i}$ is reset to 0, and the bit error detecting value $E_{0,7}$ that is stored in the bit error detecting value holding section 217 is supplied to the XOR 121 of the byte processing operation section 220 (Step SP27). In this embodiment, the bit error detecting value $E_{0,7}$=230F9088h is output. Then, the value after XOR operation with the initial value (=0) of the byte error detecting value is stored in the byte error detecting value holding section 222 (Step SP28). In this way, the byte error detecting value holding section 222 stores the value $E(x)_{P-1}$ that is the value after integration of the past bit error detecting value $E_{P,7}$ (operation value per 8 bits. The value $E(x)_{P-1}$ and the bit error detecting value $E_P$ calculated by the bit processing operation section 210 are sequentially XORed for each code string $D(x)$, thereby updating the byte error detecting value $E(x)_P$.

After the operation of 1-byte error detecting value is finished, the counter 202 increments the column count value N (Step SP29). If the column count value N turns from 303 to 0 (Yes in Step SP30), the process updates the byte row count value M (Step SP31); on the other hand, if the column count value N is a different value, the process repeats the process from Step SP22. Further, if the byte row count value M is updated, the process loads the update specific substitute value stored in the update specific substitute value table 206 into the substitute value table 204 (Step SP21) and repeats from Step SP22. If the byte row count value M turns from 215 to 0 (Yes in Step SP32), that is, when calculation of the error detecting values $E(x)$ of one recording unit block $F(x)$, 32 code strings $D(x)$ ends, the process outputs each error detecting value $E(x)$ (Step SP33). Then, when performing calculation of error detecting values of a next recording unit block (Yes in Step SP34), the process repeats from Step SP21. In this case, the substitute value table 204 loads the particular specific substitute value of the particular specific substitute value table 207 (Step SP21) and repeats the process from Step SP22.

In this example, since the data different from MSB and LSB are all "0" in the encoding bit sequence q, the value stored in the byte error detecting value holding section 222 is kept to $E_{P=0,7}$=230F9088h from the 0th byte to the recording byte sequence P=32536. If, in the code string D0, the byte data $D_{P=32537,i}$=000000001b with the recording byte sequence P=32537 is input, a corrected substitute value $R_P=X^q$ mod $G(x)$=F81FF949h that corresponds to this value is loaded from the update specific substitute value table 206. This is the byte data $D_{P=32537,i}=D_{q=7}$ to $D_{q=0}$, which is the final byte of the encoding byte sequence Q=2051 in the code string D0. The corrected substitute value $R_p=X^q$ mod $G(x)$= F81FF949h equals the value obtained by dividing the substitute code string where only $X^0$ is "1" (={00000000 . . . 00000001}) in the shift register 30.

If the bit processing operation section 210 receives byte data (D.sub.P,i), it converts the data into serial data (Step SP23, 24). The error detecting intermediate value C.sub.P,i is reset to 0. Since the data D.sub.P,0 to D.sub.P,6=0 from the 0th to 6th bits, the bit error detecting value is 0 (Step SP25 to SP30). Since the final bit data D.sub.P,7=1, the corrected substitute value X.sup.q mod G(x)=F81FF949h is loaded into the bit error detecting value holding section 217, which is then output as the byte error detecting value E.sub.P32537/ Q12051 and XORed with the integrated past byte error detecting value. Since all other bits in the code string D0 is "0", E(x)=E.sub.0+E.sub.Q=2051 where "+" represents XOR, which is a sum of mod G(x) of X.sup.16415 and mod G(x) of X.sup.0=(X.sup.16415+X.sup.0) where "+" represents XOR, is output. This value is a remainder after dividing D(x) in the shift register 30, which equals an error detecting value E(x).

As described in the foregoing, this embodiment allows calculating an error detecting value without inputting data to the shift register 30 in the encoding sequence. It is thereby possible to calculate an error detecting value regardless of the sequence of reading the data recorded on a disc. A conventional method records the data added with an error detecting code obtained by inputting data to a shift register in the encoding sequence, reads and inputs the data to the same operation section as the shift register to calculate an error detecting value. Thus, if the recording sequence (reading sequence) is different from the encoding sequence, it has been necessary to rearrange the data read in units of recording blocks once to the encoding sequence and input the data to the shift register to generate an error code and calculate an error detecting value. However, such a method requires storing recording unit blocks to a buffer in order to change the arrangement sequence of each data, which causes high occupation rate of the buffer when processing reproduction data. On the other hand, the present embodiment allows calculating an error detecting value in the reading sequence by referring to a table without inputting the data to the shift register in the encoding sequence. This eliminates the need for a buffer to store the recording unit blocks when calculating an error detecting value.

Further, the present embodiment holds only a substitute value that is used repeatedly based on the regularity of data arrangement and uses the substitute value stored in the table by updating it. This saves the number of substitute values to reduce a table size.

7. Recording Unit

Though the above description applies the present invention to an error detector in a reproducing unit, the same configuration is available when adding an error detecting code in a recording unit as described above, which allows the same operation to be performed without using the shift register 200. In this case also, it is possible to calculate an error detecting code of user data not in the encoding sequence but in the recording byte sequence, thus eliminating the need to load a recording unit block once into a buffer and rearrange the data into the encoding byte sequence.

Figure 18:
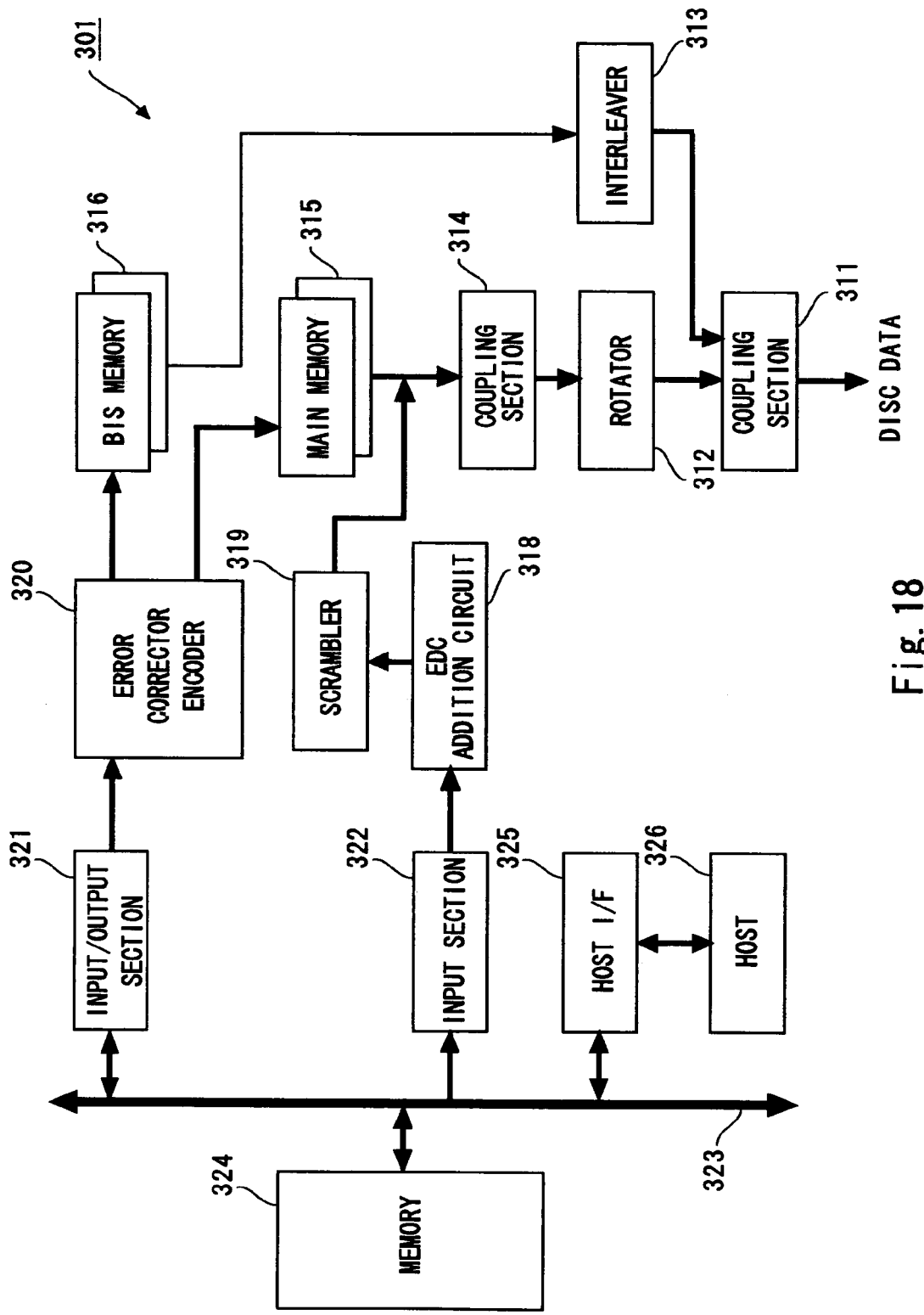
FIG. 18 is a block diagram schematically showing a part of a signal processor of a reproducing unit according to an embodiment of the present invention.

FIG. 18 is a block diagram showing the recording unit. In the recording unit, an EDC addition circuit 318 generates an error detecting code from user data supplied from a host. Then, a scrambler 319 scrambles a code string composed of user data added with EDC.

The scrambled data is then supplied to an error corrector encoder 320 where main data is error correction encoded and stored in a main memory 315. Further, auxiliary data (BIS) from an input/output section 321 is error correction encoded. The data scrambled by the scrambler 319 is coupled with an error correcting code that is stored in the main memory 315 by a coupling section 314 and supplied to a rotator 312 where it is rotated. Then, the auxiliary data is supplied to an interleaver 313 through a BIS memory 316 so that it is interleaved. A coupling section 311 couples the rotated main data and the interleaved auxiliary data and outputs the coupled data as ECC cluster. The ECC cluster is modulated and written to a disc.

The EDC addition circuit 318 of this embodiment receives user data that is supplied from the host 326 through the input section 322 in the encoding byte sequence Q. The EDC addition circuit 318 adds an error detecting code EDC(x) that is generated by inputting the user data to the shift register 200 in the encoding byte order Q to the user data, thereby generating a code string D(x).

The EDC addition circuit 318 may have the same configuration as the above error detector. That is, it at least includes a table that holds a particular specific substitute value and a shift register that generates a specific substitute value from the particular specific substitute value and supplies a specific substitute value to a bit processing operation section that calculates an error detecting code in units of bytes. Further, the EDC addition circuit 318 has a byte processing operation section that calculates XOR of these values and outputs an error correcting code. A substitute value is also prepared in the same way as above. Specifically, the substitute value corresponds to each of the encoding bit sequence q of each bit data of user data, and it can be obtained by inputting a substitute code string to the shift register shown in FIG. 11. It is possible to obtain data added with an error detecting code by exactly the same process as above if the code string is data of 2052 bytes composed of 2048-byte user data and 4-byte 0 data. Specifically, the code string may be 2052 bytes and 16416 bits just like the above-described case and the encoding bit sequence q may be associated with each bit data of the code string. The substitute code string may be a code string where only predetermined bit data corresponding to the encoding bit sequence q indicates "1" and all other bit data indicates "0".

The code string output form the EDC addition circuit 318 is then input to the scrambler 319 in the recording byte sequence P. The scrambler 319 is data descrambled from a scramble value $S_Q$ corresponding to the encoding byte sequence Q. Scrambled data $SD_Q$ associated with the encoding byte sequence Q is generated from a code string added with EDC(x).

The scrambled data $SD_Q$ is calculated from input byte data $D_Q$ and a scramble value $S_Q$ corresponding to the encoding byte sequence Q of the input byte data $D_Q$ just like the above-described descrambled data. The scrambler 319 also includes a scramble value generation section that generates a scramble value $S_Q$ corresponding to the encoding byte sequence Q for the byte data input in the recording byte sequence P. The scrambled data $DS_Q$ is generated from the generated scramble data $S_Q$ and the byte data $D_Q$ input in the recording byte sequence P, which is the same as the descrambler described above. The scrambled data is thereby supplied from the scrambler 319 to the error corrector encoder 320 in the recording byte sequence P.

If the apparatus is a recording/reproducing unit, the same components, such as an operation unit, in an error code addition circuit and an error detector, scrambler and descrambler are shared. Since neither data recording process nor data reading process requires rearrangement of data when performing scrambling/descrambling processing and error code adding/error detecting processing, it allows eliminating the need of using the memory 324.

The present invention is not restricted to the above-mentioned embodiment but various changes may be made without departing from the scope of the invention. For example, the relationship between each processing and logical configuration is not limited to the above-described example. A designer may design each circuit and disc apparatus with efficient functions and circuit configuration.

It is apparent that the present invention is not limited to the above embodiment that may be modified and changed without departing from the scope and spirit of the invention.

What is claimed is:

1. An error detector for detecting an error by calculating an error detecting value of a code string added with an error detecting code where a detection target code string to be error-detected comprises K, K being a natural number, number of bytes, each byte data being associated with a first sequence of data of the code string, and the error detecting value is obtained when the detection target code string is processed in the first sequence by a predetermined operation method, the error detector comprising:
    a substitute value output section outputting a specific substitute value corresponding to the first sequence of each byte data of the detection target code string; and
    an error detecting value calculation section calculating the error detecting value of the detection target code string according to an output result of the substitute value output section,
    wherein the error detecting value calculation section calculates the error detecting value by processing each byte data of the detection target code string and the specific substitute value corresponding to the first sequence in a second sequence of data of the code string, the second sequence being in a different direction from the first.

2. The error detector according to claim 1, wherein
    each specific substitute value corresponding to the first sequence is obtained by processing each substitute code string associated with the first sequence by the predetermined operation method, and
    wherein each substitute code string contains K number of bytes where only predetermined bit data in predetermined byte data corresponding to the first sequence indicates "1" and all other bit data indicates "0".

3. The error detector according to claim 1, wherein each specific substitute value corresponding to the first sequence comprises a value obtained by processing each substitute code string associated with the first sequence by a predetermined operation method and a substitute code string comprises a syndrome when only one bit data in K number of bytes of code string is in error.

4. The error detector according to claim 1, wherein the first sequence indicates a sequence with respect to the detection target code string, and
    wherein the second sequence indicates a sequence with respect to a recording unit block composed of a plurality of detection target code strings.

5. The error detector according to claim 4, wherein the first sequence is associated with a column direction and a second sequence is associated with a row direction in an array of byte data of the recording unit block.

6. The error detector according to claim 4, wherein the recording unit block has a first bit sequence comprising a sequence of bits of each byte data of the detection target code string in the first sequence where data is arranged in an array with the first bit sequence in a column direction, and the second sequence is associated with a row direction with respect to byte data having 8 bits each in the column direction.

7. The error detector according to claim 4, wherein the recording unit block is one of recorded and reproduced in the second sequence.

8. The error detector according to claim 5, wherein
the substitute value output section includes a table storing at least part of the specific substitute value and outputs the specific substitute value corresponding to the first sequence of the byte data each time byte data is input in the second sequence,
the error detecting value calculation section includes a bit processing operation section processing each byte data in units of bit data, and a byte processing operation section calculating an error detecting value according to an operation result of the bit processing operation section, and
wherein the bit processing operation section includes:
a conversion section converting byte data input in the second sequence into bit data;
a substitute value conversion section converting the specific substitute value read from the substitute value output section into a substitute value corresponding to bit data output from the conversion section; and
a byte error detecting value operation section calculating a byte error detecting value for each byte from bit data output from the conversion section and the substitute value converted by the substitute value conversion section.

9. The error detector according to claim 8, wherein the byte processing operation section includes a holding section holding the same number of error detecting values as the detection target code strings and calculates an error detecting value for each detection target code string.

10. The error detector according to claim 8, wherein
each byte data of the detection target code string has a first bit sequence that is a first sequence and indicates a bit sequence,
wherein the substitute value corresponds to the first bit sequence, and
wherein the substitute value conversion section converts the specific substitute value corresponding to input byte data into a substitute value corresponding to the first bit sequence of bit data converted by the conversion section.

11. The error detector according to claim 10, wherein the substitute value conversion section sets a value obtained by performing a predetermined operation on the substitute value corresponding to $i(0 \leq i \leq 7)$th bit data as a substitute value corresponding to $(i+1)$th bit data during processing one byte data.

12. The error detector according to claim 5, wherein
the substitute value output section includes a table storing a specific substitute value contained in one row and converts the specific substitute value contained in one row into a specific substitute value corresponding to the first sequence of the byte data and outputs the converted value each time byte data is input in the second sequence,
wherein the error detecting value calculation section includes a bit processing operation section processing each byte data in units of bit data, and a byte processing operation section calculating an error detecting value according to an operation result of the bit processing operation section,
wherein the bit processing operation section includes:
a conversion section converting the byte data input in the second sequence into bit data;
a substitute value conversion section converting the specific substitute value read from the substitute value output section into a substitute value corresponding to bit data output from the conversion section; and
a byte error detecting value operation section outputting a byte error detecting value for each byte from bit data output from the conversion section and the substitute value converted by the substitute value conversion section.

13. The error detector according to claim 5, wherein the recording unit block has a plurality of detection target code string sets, each set having two or more detection target code strings,
wherein the substitute value output section includes a particular specific substitute value table storing a specific substitute value corresponding to one row of one detection target code string set as a particular specific substitute value and converts the particular specific substitute value into a specific substitute value corresponding to the first sequence of the byte data and outputs the converted value each time byte data is input in the second sequence,
wherein the error detecting value calculation section includes a bit processing operation section processing one byte data in units of bit data, and a byte processing operation section calculating an error detecting value according to an operation result of the bit processing operation section,
wherein the bit processing operation section includes:
a conversion section converting the byte data input in the second sequence into bit data;
a substitute value conversion section converting the specific substitute value read from the substitute value output section into a substitute value corresponding to bit data output from the conversion section; and
a byte error detecting value operation section outputting a byte error detecting value for each byte from bit data output from the conversion section and the substitute value converted by the substitute value conversion section.

14. An error detector for detecting an error by calculating an error detecting value of a code string added with an error detecting code where a detection target code string to be error-detected comprises k, k being a natural number, number of bits, each bit data being associated with a first bit sequence, and the error detecting value is obtained when the detection target code string is processed in the first bit sequence by a predetermined operation method, the error detector comprising:
a substitute value output section outputting at least part of each substitute value associated with the first bit sequence of each bit data of the detection target code string; and
an error detecting value calculation section calculating the error detecting value of the detection target code string according to an output result of the substitute value output section, wherein the error detecting value calculation section calculates the error detecting value by processing each bit data of the detection target code string and the substitute value corresponding to the first bit sequence in a different sequence, the different sequence is different from the first bit sequence.

15. The error detector according to claim 14, wherein each substitute value corresponding to the first bit sequence is obtained by processing each substitute code string associated with the first bit sequence by a predetermined operation method, and
wherein each substitute code string contains k number of bytes where only predetermined bit data corresponding to the first bit sequence indicates "1" and all other bit data indicates "0".

16. An error detecting method, comprising:
inputting a detection target code string in a second sequence different from a first sequence to calculate an error detecting value that is obtained when a detection target code string to be error-detected that contains K, K being a natural number, number of bytes, each byte data being associated with a first sequence, is processed in the first sequence by a predetermined operation method;
generating a specific substitute value corresponding to the first sequence of each byte data by referring to a table storing at least part of K number of specific substitute values associated with the first sequence; and
calculating the error detecting value by processing each byte data of the detection target code string and the specific substitute value corresponding to the first sequence in the second sequence.

17. An error detecting code addition circuit for generating an error detecting code addition code string of K, K being a natural number, number of bytes composed of user data added with an error detecting code from a processing target code string of K number of bytes containing user data, where the processing target code string has each data associated with a first sequence, and the error detecting code addition code string is obtained by processing the processing target code string in the first sequence by a predetermined operation process, the error detecting code addition circuit comprising:
a substitute value output section outputting a specific substitute value corresponding to the first sequence of each byte data of the processing target code string; and
a code string generation section calculating the error detecting code addition code string according to an output result of the substitute value output section,
wherein the code string generation section generates the error detecting code addition code string by processing each byte data of the processing target code string and the specific substitute value corresponding to the first sequence in a second sequence different from the first sequence.

18. A disc apparatus, comprising:
a reading section reading error detecting code addition code string added with an error detecting code; and
an error detection section detecting an error by calculating an error detecting code of the error detecting code addition code string,
wherein the error detecting code addition code string contains K, K being a natural number, number of bytes, each byte data associated with the first sequence,
wherein the error detecting value is obtained when a detection target code string is processed in the first sequence with a predetermined operation method,
wherein the error detection section includes:
a substitute value output section outputting a specific substitute value corresponding to the first sequence of each byte data in the error detecting code addition code string; and
an error detecting value calculation section calculating the error detecting value in the error detecting code addition code string according to an output result of the substitute value output section, and
wherein the error detecting value calculation section calculates the error detecting value by processing each byte data of the error detecting code addition code string and the specific substitute value corresponding to the first sequence in a second sequence different from the first sequence.

19. An disc apparatus, comprising:
an error detecting code addition section generating an error detecting code addition code string of K, K being a natural number, number of bytes composed of user data added with an error detecting code from a processing target code string of K number of bytes containing user data; and
a recording section recording data generated based on the error detecting code addition code string,
wherein the processing target code string has each byte data associated with a first sequence,
wherein the error detecting code addition code string is obtained by processing the processing target code string in the first sequence with a predetermined operation method,
wherein the error detecting code addition section includes:
a substitute value output section outputting a specific substitute value corresponding to the first sequence of each byte data of the processing target code string; and
a code string generation section calculating the error detecting code addition code string according to an output result of the substitute value output section, and
wherein the code string generation section generates the error detecting code addition code string by processing each byte data of the processing target code string and the specific substitute value corresponding to the first sequence in a second sequence different from the first sequence.

20. A disc apparatus, comprising:
a descrambler generating descrambled code string by descrambling scrambled code string obtained based on each byte data of a code string of K, K being a natural number, number of bytes, each byte associated with a first sequence, and a scramble value corresponding to the first sequence of the byte data; and
an error detector detecting an error by calculating an error detecting value of the descrambled code string,
wherein each scramble value corresponding to the first sequence is obtained by performing a predetermined operation corresponding to the first sequence on an initial value,
wherein each byte data of the descrambled code string is associated with the first sequence,
wherein the error detecting value is obtained when the descrambled code string is processed in the first sequence with a predetermined operation method, wherein the descrambler includes:
   a scramble value generation section generating a scramble value corresponding to the first sequence of each byte data in the descrambled code string that is input in a second sequence different from the first sequence; and
   a code string operation section calculating the descrambled data from the input byte data and the scramble value corresponding to the first sequence of the byte data, and wherein the error detector includes:
   a substitute value output section outputting a specific substitute value corresponding to the first sequence of each byte data of the descrambled code string; and
   an error detecting value calculation section calculating the error detecting value by processing each byte data of the descrambled code string and the specific substitute value corresponding to the first sequence in the second sequence according to an output result of the substitute value output section.

* * * * *